US009959805B2

(12) United States Patent
Itoigawa et al.

(10) Patent No.: US 9,959,805 B2
(45) Date of Patent: May 1, 2018

(54) SEMICONDUCTOR DEVICE AND MODULE ADAPTED TO BOTH MIPI C-PHY AND MIPI D-PHY

(71) Applicant: Synaptics Japan GK, Tokyo (JP)

(72) Inventors: Keiichi Itoigawa, Tokyo (JP); Yoshihiko Hori, Tokyo (JP); Tomomitsu Kitamura, Tokyo (JP); Takefumi Seno, Tokyo (JP); Hideaki Kuwada, Tokyo (JP); Takashi Tamura, Tokyo (JP); Jun Kurosawa, Tokyo (JP); Kazuhiko Kanda, Tokyo (JP)

(73) Assignee: Synaptics Japan GK, Tokyo (JP)

( * ) Notice: Subject to any disclaimer, the term of this patent is extended or adjusted under 35 U.S.C. 154(b) by 0 days. days.

(21) Appl. No.: 15/218,167

(22) Filed: Jul. 25, 2016

(65) Prior Publication Data

US 2017/0032757 A1     Feb. 2, 2017

(30) Foreign Application Priority Data

Jul. 27, 2015 (JP) .................................. 2015-147677

(51) Int. Cl.
*G09G 3/00* (2006.01)
*G09G 3/20* (2006.01)
(Continued)

(52) U.S. Cl.
CPC ........... *G09G 3/2096* (2013.01); *G09G 5/008* (2013.01); *H03L 7/00* (2013.01); *G09G 2300/0408* (2013.01); *G09G 2300/0426* (2013.01); *G09G 2310/0202* (2013.01); *G09G 2310/0291* (2013.01); *G09G 2352/00* (2013.01)

(58) Field of Classification Search
CPC ......... G09G 2310/0291; G09G 3/2096; G09G 5/008; G09G 2352/00; G09G 2300/0408; G09G 2300/0426; G09G 2310/0202; H03L 7/00
See application file for complete search history.

(56) References Cited

U.S. PATENT DOCUMENTS

| | | | | |
|---|---|---|---|---|
| 9,520,988 | B1* | 12/2016 | Wiley | .................. H04L 7/0083 |
| 2014/0071892 | A1* | 3/2014 | Liu | ......................... H04W 8/00 |
| | | | | 370/328 |

(Continued)

*Primary Examiner* — Muhammad N Edun
(74) *Attorney, Agent, or Firm* — Patterson + Sheridan, LLP

(57) ABSTRACT

A semiconductor device includes first to sixth external connection terminals, a first receiver connected to the first and second external connection terminals, a second receiver connected to the third and fourth external connection terminals, a third receiver connected to the fifth and sixth external connection terminals, a C-PHY block, a D-PHY block and a main processing section. The C-PHY block is configured to generate first reception data by performing signal processing on signals received from the first, second and third receivers in accordance with the MIPI C-PHY specification. The D-PHY block is configured to generate second reception data by performing signal processing on signals received from the first, second and third receivers in accordance with the MIPI D-PHY specification. The main processing section is configured to selectively receive the first and second reception data and perform desired processing on the received data.

20 Claims, 32 Drawing Sheets

(51) Int. Cl.
  *H03L 7/00* (2006.01)
  *G09G 5/00* (2006.01)

(56) References Cited

U.S. PATENT DOCUMENTS

2014/0241465 A1    8/2014  Itoigawa et al.
2015/0370305 A1*  12/2015  Wietfeldt .............. G06F 1/3206
                                                          713/320

* cited by examiner

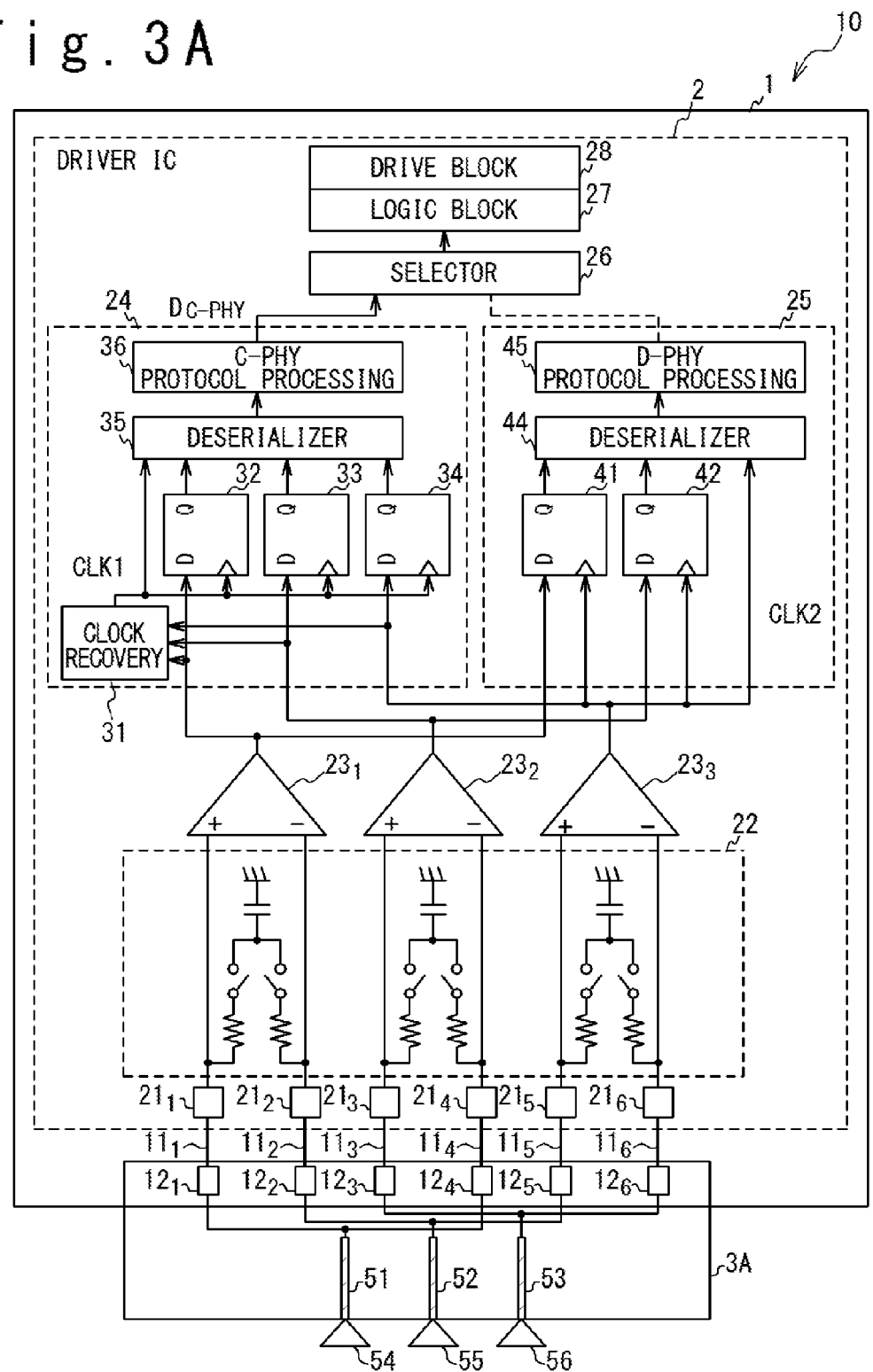

SEMICONDUCTOR DEVICE AND MODULE ADAPTED TO BOTH MIPI C-PHY AND MIPI D-PHY

CROSS REFERENCE

This application claims priority of Japanese Patent Application No. 2015-147677, filed on Jul. 27, 2015, the disclosure which is incorporated herein by reference.

TECHNICAL FIELD

The present invention relates to semiconductor devices, display panel drivers and display modules, more particularly, to communication interfaces suitably used for semiconductor devices, display panel drivers and display modules.

BACKGROUND ART

The MIPI (Mobile Industry Processor Interface) alliance is known as an organization which develops specifications of communication interfaces. The MIPI specifications, which are standardized by the MIPI alliance, are widely used for communications between hosts (e.g. processors) and peripheral devices (e.g. display devices).

MIPI D-PHY is one of the MIPI specifications, which is most typically used for communications between an application processor and a display module in a portable device. In MIPI D-PHY interfacing, communications are achieved with one clock lane and one to four data lanes. Each lane includes a pair of signal lines transmitting a low-amplitude differential signal. The clock lane is used to transmit a differential clock signal, and each data lane is used to transmit a differential data signal. When the communication interface is placed in the HS (high speed) mode, in which high-speed communications are implemented, the transmitting side transmits a differential clock signal over the clock lane and a set of differential data signals over the data lanes. The receiving side achieves data reception by latching the differential data signals transmitted over the data lanes in synchronization with the differential clock signal transmitted over the clock lane. Note that Japanese Patent Application Publication No. 2014-168195 A discloses a communications system operated in accordance with the MIPI D-PHY specification.

Recent enhancement in the display resolution of display panels has necessitated high-speed transmission of image data, and therefore communication interfaces are required to operate at a higher speed. The MIPI C-PHY specification is a newly-defined specification developed to meet this requirement. In a MIPI C-PHY system, communications are achieved with three signal lines. The signal lines respectively transmit three-valued low-amplitude signals (which are allowed to take three values: "high", "low" and "middle") and the three-valued signals are converted into a binary logic signal on the reception side. One feature of MIPI C-PHY is that the clock is embedded in data signals; the reception side performs clock recovery in receiving the data signals.

Although the use of MIPI C-PHY effectively achieves high-speed communications, it is not necessarily easy to use a newly-defined communication specification. Accordingly, some users may desire to adopt the MIPI D-PHY specification and other users may desire to adopt the MIPI C-PHY specification. It would be desirable if vendors provide semiconductor devices adapted to both of these two specifications.

In a simplest approach, both of a communication interface supporting the MIPI D-PHY specification and a communication interface supporting the MIPI C-PHY specification may be monolithically integrated in a semiconductor integrated circuit; however, simply integrating multiple independent communication interfaces into one semiconductor device undesirably increases the circuit size.

Accordingly, there is a technical need for providing a semiconductor device supporting both of the MIPI D-PHY and MIPI C-PHY specifications with a reduced circuit size.

SUMMARY OF INVENTION

Accordingly, one objective of the present invention is to provide a semiconductor device, display panel driver and display module which support both of the MIPI D-PHY and MIPI C-PHY specifications with a reduced circuit size.

Other objectives and new features would be understood to a person skilled in the art from the following disclosure.

In one embodiment, a semiconductor device includes first to sixth external connection terminals, a first receiver connected to the first and second external connection terminals, a second receiver connected to the third and fourth external connection terminals, a third receiver connected to the fifth and sixth external connection terminals, a C-PHY block, a D-PHY block and a main processing section. The C-PHY block is configured to generate first reception data by performing signal processing on signals received from the first, second and third receivers in accordance with the MIPI C-PHY specification. The D-PHY block is configured to generate second reception data by performing signal processing on signals received from the first, second and third receivers in accordance with the MIPI D-PHY specification. The main processing section is configured to selectively receive the first and second reception data and perform desired processing on the received data.

In another embodiment, a semiconductor device module includes a circuit board including: a semiconductor device configured as described above; a first transmission line electrically connected to the first external connection terminal; a second transmission line electrically connected to the third external connection terminal; and a third transmission line electrically connected to the fifth external connection terminal. This configuration is adapted to communications in accordance with the MIPI C-PHY specification. In this case, the main processing section of the semiconductor device receives the first reception data to operate.

In still another embodiment, a semiconductor device module includes a semiconductor device configured as described above and a circuit board including first to sixth transmission lines electrically connected with the first to sixth external connection terminals, respectively. This configuration is adapted to communications in accordance with the MIPI D-PHY specification. In this case, the main processing section of the semiconductor device receives the second reception data to operate.

In still another embodiment, a display panel driver is provided which drives a display panel. The display panel driver includes first to sixth external connection terminals, a first receiver connected to the first and second external connection terminals, a second receiver connected to the third and fourth external connection terminals, a third receiver connected to the fifth and sixth external connection terminals, a C-PHY block, a D-PHY block and a main processing section. The C-PHY block is configured to generate first reception data by performing signal processing on signals received from the first, second and third receivers in accordance with the MIPI C-PHY specification. The D-PHY block is configured to generate second reception data by performing signal processing on signals received from the first, second and third receivers in accordance with the MIPI D-PHY specification. The main processing section is configured to selectively receive the first and second reception data and drives the display panel in response to the received data.

In still another embodiment, a display module includes a display panel, a display panel driver configured as described above, and a flexible circuit board. The flexible circuit board includes: a first transmission line electrically connected to the first external connection terminal; a second transmission line electrically connected to the fifth external connection terminal; and a third transmission line electrically connected to the third external connection terminal. This configuration is adapted to communications in accordance with the MIPI C-PHY specification. In this case, the main processing section of the display panel driver receives the first reception data and drives the display panel in response to the first reception data.

In still another aspect, a display module includes a display panel, a display panel driver configured as described above, and a flexible circuit board. The flexible circuit board includes first to sixth transmission lines electrically connected to the first to sixth external connection terminals, respectively. This configuration is adapted to communications in accordance with the MIPI D-PHY specification. In this case, the main processing section of the display panel driver receives the second reception data and drives the display panel in response to the second reception data.

The present invention provides a semiconductor device, display panel driver and display module which support both of the MIPI D-PHY and MIPI C-PHY specifications with a reduced circuit size relative to forming the MIPI D-PHY and MIPI C-PHY separately.

BRIEF DESCRIPTION OF THE DRAWINGS

The above and other advantages and features of the present invention will be more apparent from the following description taken in conjunction with the accompanied drawings, in which:

FIG. 3A is a block diagram illustrating an exemplary implementation in which the driver IC illustrated in FIG. 2 is applied to a display module which performs communications in accordance with the MIPI C-PHY specification;

DESCRIPTION OF PREFERRED EMBODIMENTS

Figure 1:
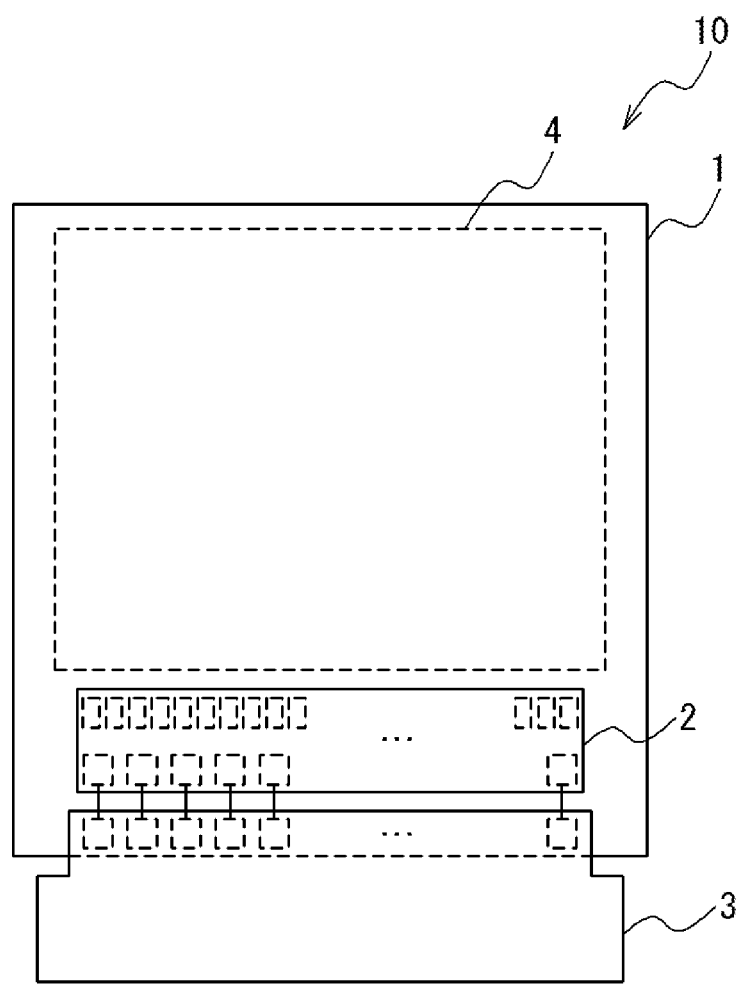
FIG. 1 is a conceptual diagram illustrating an exemplary configuration of a display module in one embodiment.

The invention will be now described herein with reference to illustrative embodiments. Those skilled in the art would recognize that many alternative embodiments can be accomplished using the teachings of the present invention and that the invention is not limited to the embodiments illustrated for explanatory purposed. It would be appreciated that the same or corresponding elements may be denoted by the same or corresponding reference numerals in the following disclosure. It would be also appreciated that for simplicity and clarity of illustration, elements in the Figures have not necessary drawn to scale. For example, the dimensions of some of the elements are exaggerated relative to other elements.

Overall Configuration and Operation

FIG. 1 is a schematic view illustrating an exemplary configuration of a display module 10 in one embodiment. The display module 10 includes a liquid crystal display panel 1, a driver IC (integrated circuit) 2 and a flexible circuit board 3. The liquid crystal display panel 1 includes a display region 4 in which images are displayed. Disposed in the display region 4 are pixels, gate lines (also referred to as scan lines or digit lines) and source lines (also referred to as signal lines or data lines).

The driver IC 2 is a semiconductor device configured to drive the liquid crystal display panel 1. More specifically, the driver IC 2 drives the source lines of the liquid crystal display panel 1, and, when a gate line drive circuit (often referred to as GIP (gate-in-panel) circuit) which drives the gate lines is integrated in the liquid crystal display panel 1, the driver IC 2 also supplies control signals used to control the gate line drive circuit. When a gate line drive circuit is not integrated in the liquid crystal display panel 1, the driver IC 2 may be configured to drive the gate lines. The driver IC 2 is mounted on the liquid crystal display panel 1 through a surface mounting technique, such as a COG (chip on glass) technique.

The flexible circuit board 3 includes transmission lines used for communications between a host (not illustrated) and the driver IC 2. As described later, external connection terminals of the driver IC 2 are connected to the transmission lines integrated on the flexible circuit board 3 through interconnections formed on the glass substrate of the liquid crystal display panel 1.

Figure 2:
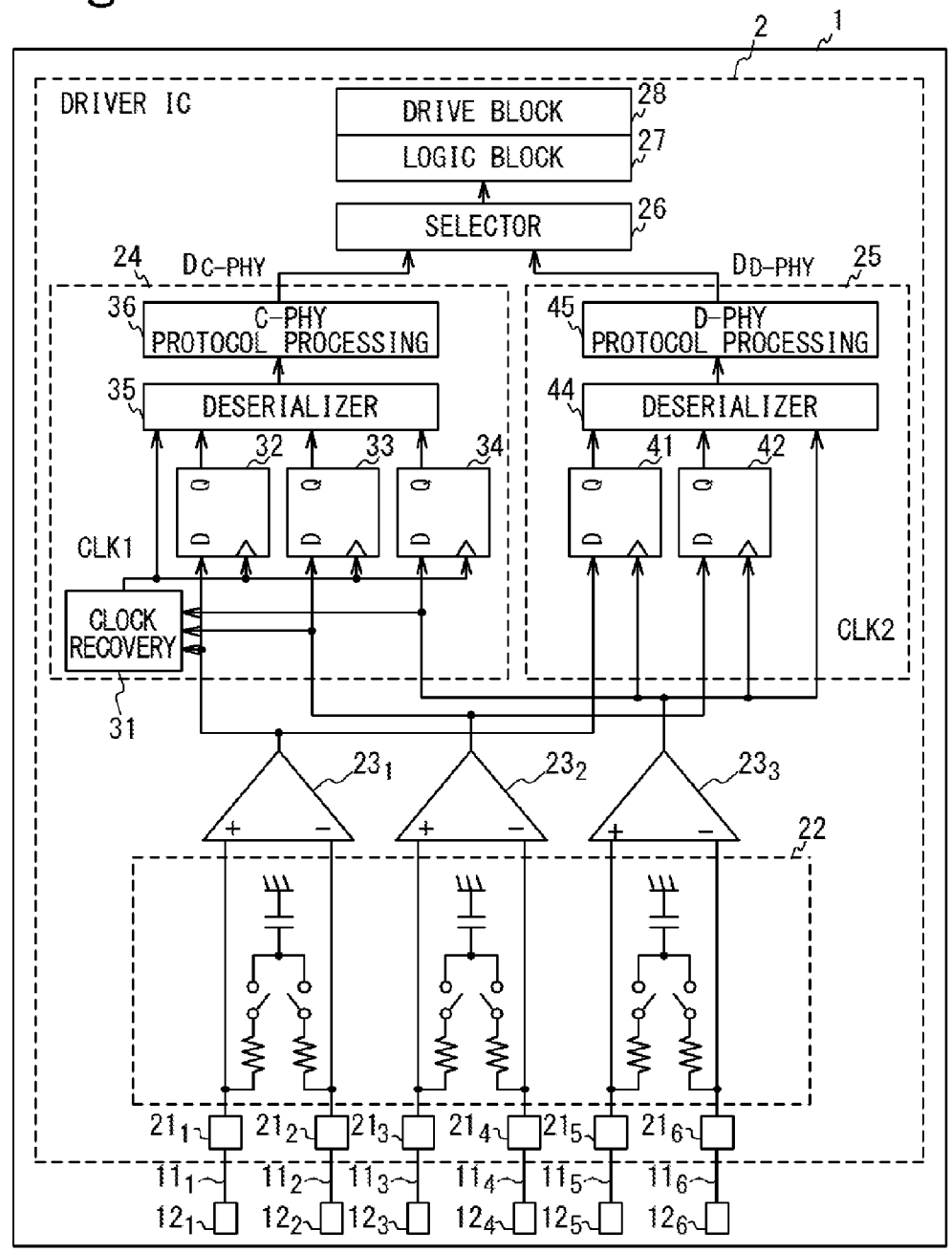
FIG. 2 is a block diagram illustrating an exemplary configuration of a driver IC in one embodiment.

FIG. 2 is a block diagram illustrating an exemplary configuration of the driver IC 2. The driver IC 2 includes external connection terminals $21_1$ to $21_6$, a terminal resistor circuit 22, receivers $23_1$ to $23_3$, a C-PHY block 24, a D-PHY block 25, a selector 26, a logic block 27 and a drive block 28.

The external connection terminals $21_1$ to $21_6$ are used to receive signals transmitted from a host in the communications with the host. In the present embodiment, each of the external connection terminals $21_1$ to $21_6$, which are formed through a COG technique, includes a pad and a bump. The external connection terminals $21_1$ to $21_6$ are connected to interconnections $11_1$ to $11_6$ formed on the glass substrate of the liquid crystal display panel 1, respectively. The interconnections $11_1$ to $11_6$ are connected to the connection terminals $12_1$ to $12_6$ which are connected to transmission lines of the flexible circuit board 3, respectively. This implies that the external connection terminals $21_1$ to $21_6$ are electrically connected to the transmission lines of the flexible circuit board 3 via the interconnections $11_1$ to $11_6$ and the connection terminals $12_1$ to $12_6$.

The terminal resistor circuit 22 is configured to provide a proper terminal resistance to each of the external connection terminals $21_1$ to $21_6$. Note that the configuration of the terminal resistor circuit 22 is illustrated in a simplified form in FIG. 2; details of the configuration of the terminal resistor circuit 22 are described later.

The receivers $23_1$, $23_2$ and $23_3$ receive the signals transmitted from the host. In the configuration illustrated in FIG. 2, the receivers $23_1$, $23_2$ and $23_3$ are each configured as a differential amplifier having a non-inverting input (+) and an inverting input (−); the receivers $23_1$, $23_2$ and $23_3$ each convert the differential signal received on the non-inverting and inverting inputs thereof into a single-ended signal. The non-inverting input of the receiver $23_1$ is connected to the external connection terminal $21_1$, and the inverting input is connected to the external connection terminal $21_2$. Correspondingly, the non-inverting input of the receiver $23_2$ is connected to the external connection terminal $21_3$ and the inverting input is connected to the external connection terminal $21_4$, while the non-inverting input of the receiver $23_3$ is connected to the external connection terminal $21_5$ and the inverting input is connected to the external connection terminal $21_6$.

The C-PHY block 24 performs signal processing on the signals received from the receivers $23_1$, $23_2$ and $23_3$ in accordance with the MIPI C-PHY specification, to thereby extract various data (such as control data and image data) transmitted from the host. More specifically, the C-PHY block 24 includes: a clock recovery circuit 31, flipflops 32, 33, 34, a deserializer 35 and a C-PHY protocol processing circuit 36.

The clock recovery circuit 31 performs clock recovery on the signals received from the receivers $23_1$, $23_2$ and $23_3$ to generate a clock signal CLK1. The flipflops 32, 33 and 34 constitute a latch circuit which latches the signals received from the receivers $23_1$, $23_2$ and $23_3$; the flipflops 32, 33 and 34 respectively generate a data stream by latching the signals received from the receivers $23_1$, $23_2$ and $23_3$ in synchronization with the clock signal CLK1. The deserializer 35 and the C-PHY protocol processing circuit 36 constitute a data processing section which extracts reception data from the data streams output from the flipflops 32, 33 and 34. In detail, the deserializer 35 deserializes the data streams received from the flipflops 32, 33 and 34. The C-PHY protocol processing circuit 36 performs data processing on the data received from the deserializer 35 in accordance with the MIPI C-PHY specification, to thereby extract desired reception data (such as control data and image data). In the following, the reception data obtained by the C-PHY block 24 thus configured (that is, the reception data received from the C-PHY protocol processing circuit 36) may be referred to as reception data $D_{C\text{-}PHY}$.

The D-PHY block 25 performs signal processing on the signals received from the receivers $23_1$, $23_2$ and $23_3$ in accordance with the MIPI D-PHY specification, to thereby extract various data (such as control data and image data) transmitted from the host. More specifically, the D-PHY block 25 includes: flipflops 41, 42, a deserializer 44 and a D-PHY protocol processing circuit 45.

The D-PHY block 25 is configured to latch the signals received from the receivers $23_1$ and $23_2$ by using the signal received from the receiver $23_3$ as a clock signal CLK2. The flipflops 41 and 32 constitute a latch circuit which latches the signals received from the receivers $23_1$ and $23_2$; the flipflops 41 and 42 generate data streams by respectively latching the signals received from the receivers $23_1$ and $23_2$ in synchronization with the clock signal CLK2 (that is, the signal received from the receiver $23_3$). The deserializer 44 and the D-PHY protocol processing circuit 45 constitute another data processing section which extracts reception data from the data streams received from the flipflops 41 and 42. In detail, the deserializer 44 deserializes the data streams received from the flipflops 41 and 42. The D-PHY protocol processing circuit 45 performs data processing on the data received from the deserializer 44 in accordance with the MIPI D-PHY specification, to thereby extract desired reception data (such as control data and image data). In the following, the reception data obtained by the D-PHY block 24 thus configured (that is, the reception data output from the D-PHY protocol processing circuit 45) may be referred to as reception data $D_{C\text{-}PHY}$.

The selector 26 selects one of the C-PHY and PHY blocks 24 and 25 and forwards the reception data received from the selected block to the logic block 27. When the C-PHY block 24 is selected, the selector 26 forwards the reception data $D_{C\text{-}PHY}$ received from the C-PHY block 24 to the logic block 27. When the D-PHY block 26 is selected, the selector 26 forwards the reception data $D_{D\text{-}PHY}$ received from the D-PHY block 25 to the logic block 27.

The logic block 27 and the drive block 28 operate as a main processing section which performs desired processing on the reception data received from the selector 26. In detail, the logic block 27 controls various circuits integrated in the driver IC 2 in response to control data included in the reception data, and also performs image processing on image data. The drive block 28 drives the liquid crystal display panel 1 in response to the image data and the control data.

The driver IC 2 configured as illustrated in FIG. 2 are adapted to both of the communications in accordance with the MIPI C-PHY specification and the communications in accordance with the MIPI D-PHY specification, by modifying the routing of transmission lines on the flexible circuit board 3. It should be noted that the external connection terminals $21_1$ to $21_6$ and the receivers $23_1$ to $23_3$ are used for both of the communications in accordance with the MIPI C-PHY specification and the communications in accordance with the MIPI D-PHY specification. This effectively reduces the circuit size.

FIG. 3A illustrates one exemplary implementation in which the driver IC 2 is applied to a display module which performs communications in accordance with the MIPI C-PHY specification. The flexible circuit board 3A includes three transmission lines 51, 52 and 53 used for communications in accordance with the MIPI C-PHY specification. The transmission lines 51, 52 and 53 transmit signals received from transmitters 54, 55 and 56, respectively. The transmission line 51 is connected to the connection terminals $12_1$ and $12_4$ disposed on the liquid crystal display panel 1. Similarly, the transmission line 52 is connected to the connection terminals $12_2$ and $12_5$ and the transmission line 53 is connected to the connection terminals $12_3$ and $12_6$. In other words, the transmission line 51 is commonly connected to the non-inverting input (+) of the receiver $23_1$ and the inverting input (−) of the receiver $23_2$, the transmission line 52 is commonly connected to the inverting input of the receiver $23_2$ and the non-inverting input of the receiver $23_3$, and the transmission line 53 is commonly connected to the non-inverting input of the receiver $23_3$ and the inverting input of the receiver $23_1$. Such connections allow converting three-valued signals transmitted over the transmission lines 51, 52 and 53 into binary single-ended signals with the receivers $23_1$ to $23_3$.

Furthermore, the single-ended signals output from the receivers $23_1$ to $23_3$ are latched by the flipflops 32 to 34 in synchronization with the clock signal CLK1 generated through clock recovery by the clock recovery circuit 31 and the data streams output from the flipflops 32 to 34 are processed by the deserializer 35 and the C-PHY protocol processing circuit 36 to generate the reception data $D_{C\text{-}PHY}$. The C-PHY block 24 is selected by the selector 26 and thereby the reception data $D_{C\text{-}PHY}$ generated by the C-PHY block 24 are supplied to the logic block 27. The above-described operation effectively achieves communications in accordance with the MIPI C-PHY specification.

Figure 3B:
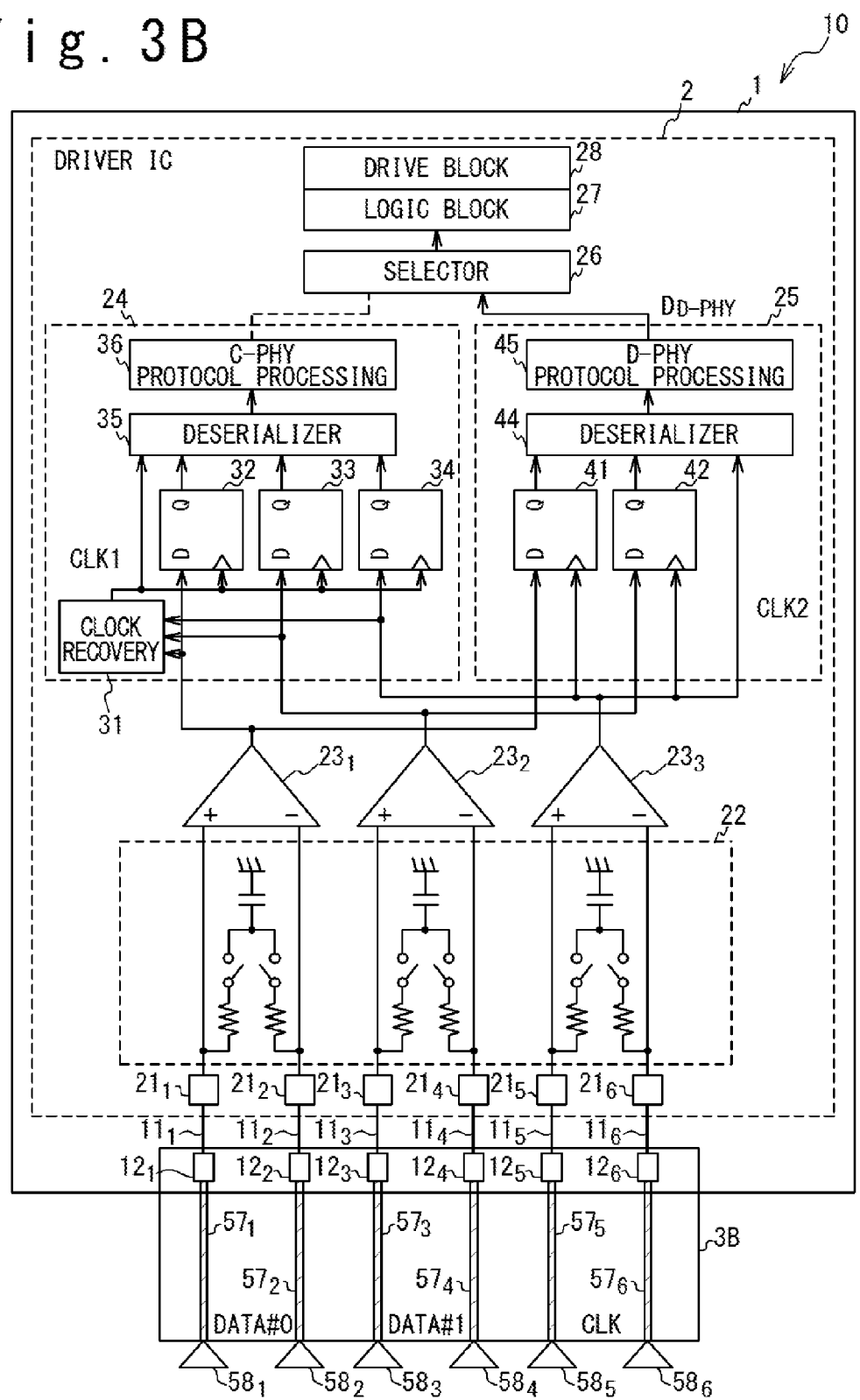
FIG. 3B is a block diagram illustrating an exemplary implementation in which the driver IC illustrated in FIG. 2 is applied to a display module which performs communications in accordance with the MIPI D-PHY specification.

FIG. 3B illustrates one exemplary implementation in which the driver IC 2 is applied to a display module which performs communications in accordance with the MIPI D-PHY specification. The flexible circuit board 3B includes transmission lines $57_1$ to $57_6$ used for communications in accordance with the MIPI D-PHY specification. The transmission lines $57_1$ to $57_6$ are connected to the transmitters $58_1$ to $58_6$, respectively. It should be noted that the transmission lines $57_1$ and $57_2$ are used as data lane #0 and the transmission lines $57_3$ and $57_4$ are used as data lane #1. The transmission lines $57_5$ and $57_6$ are used as a clock lane. The transmission lines $57_1$ to $57_6$ are connected to the connection terminals $12_1$ to $12_6$, respectively. In other words, the transmission line $57_1$ is connected to the non-inverting input (+) of the receiver $23_1$ and the transmission line $57_2$ is connected to the inverting input (−) of the receiver $23_1$. Also, the transmission line $57_3$ is connected to the non-inverting input (+) of the receiver $23_2$ and the transmission line $57_4$ is connected to the inverting input (−) of the receiver $23_2$. Finally, the transmission line $57_5$ is connected to the non-inverting input (+) of the receiver $23_3$ and the transmission line $57_6$ is connected to the inverting input (−) of the receiver $23_3$.

In such connections, the differential clock signal transmitted over the clock lane is input to the receiver $23_3$ and the clock signal CLK2, which is a single-ended signal, is generated by the receiver $23_3$. In the meantime, the differential data signal transmitted over the transmission lines $57_1$ and $57_2$ (i.e., data lane #0) is input to the receiver $23_1$ and the differential data signal transmitted over the transmission lines $57_3$ and $57_4$ (i.e., data lane #1) is input to the receiver $23_2$. The differential data signals transmitted over data lanes #0 and #1 are converted into binary single-ended signals by the receivers $23_1$ and $23_2$. Furthermore, the single-ended signals output from the receivers $23_1$ and $23_2$ are latched by the flipflops 41 and 42 in synchronization with the clock signal CLK2 generated by the receiver $23_3$ and the data streams output from the flipflops 41 and 42 are processed by the deserializer 44 and the D-PHY protocol processing circuit 45 to generate the reception data $D_{D\text{-}PHY}$. The D-PHY block 25 is selected by the selector 26 and thereby the reception data $D_{D\text{-}PHY}$ generated by the D-PHY block 25 are supplied to the logic block 27. The above-described operation effectively achieves communications in accordance with the MIPI D-PHY specification.

It should be noted that, although only two data lanes are illustrated in FIG. 3B, a person skilled in the art would appreciate that the number of data lanes may be increased by integrating an additional receiver(s) in the driver IC 2 and disposing additional transmission lines on the flexible circuit board 3B. As described above, the MIPI D-PHY specification allows maximum four data lanes.

Although the receiver $23_3$, which is connected to both of the C-PHY block 24 and the D-PHY block 25, is used to generate the clock signal CLK2 used in the D-PHY block 25 in the configuration illustrated in FIG. 2, the clock signal CLK2 may be generated by a receiver connected only to the D-PHY block 25.

Figure 4:
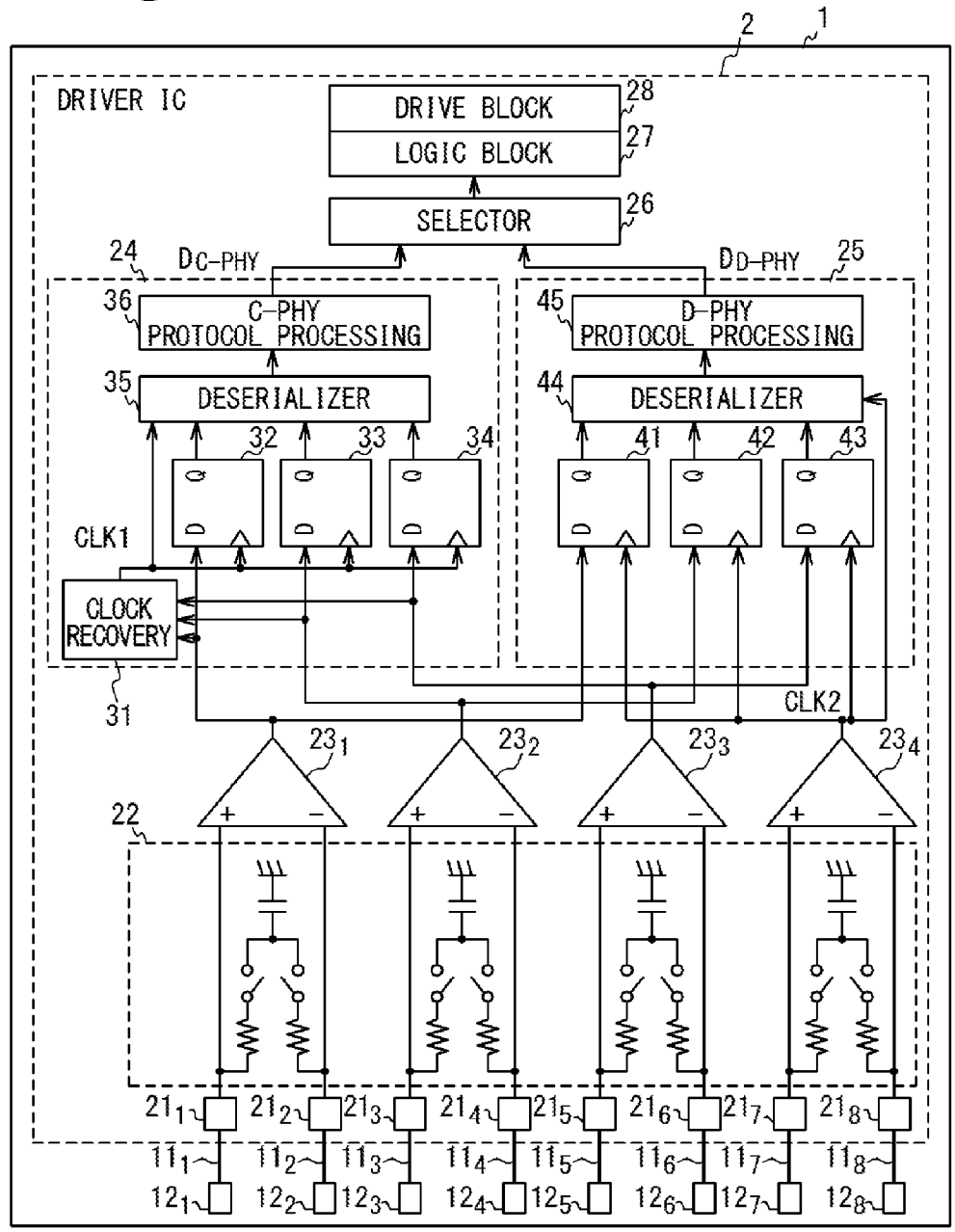
FIG. 4 is a block diagram illustrating an exemplary modification of the driver IC of the present embodiment.

FIG. 4 is a block diagram illustrating an exemplary configuration of a driver IC 2 thus configured. The configuration of the driver IC 2 illustrated in FIG. 4 is almost similar to that illustrated in FIG. 2. It should be noted that the driver IC 2 illustrated in FIG. 4 additionally includes a receiver $23_4$. The non-inverting input (+) of the receiver $23_4$ is connected to an external connection terminal $21_7$ and the inverting input (−) is connected to an external connection terminal $21_8$. The liquid crystal display panel 1 additionally includes interconnections $11_7$, $11_8$ and connection terminals $12_7$ and $12_8$. The external connection terminal $21_7$ is connected to the connection terminal $12_7$ via the interconnection $11_7$ and the external connection terminal $21_8$ is connected to the connection terminal $12_8$ via the interconnection $11_8$. The D-PHY block 25 additionally includes a flipflop 43. The flipflops 41 to 43 respectively latch the signals received from the receivers $23_1$ to $23_3$ by using the signal received from the receiver $23_4$ as the clock signal CLK2.

Figure 5:
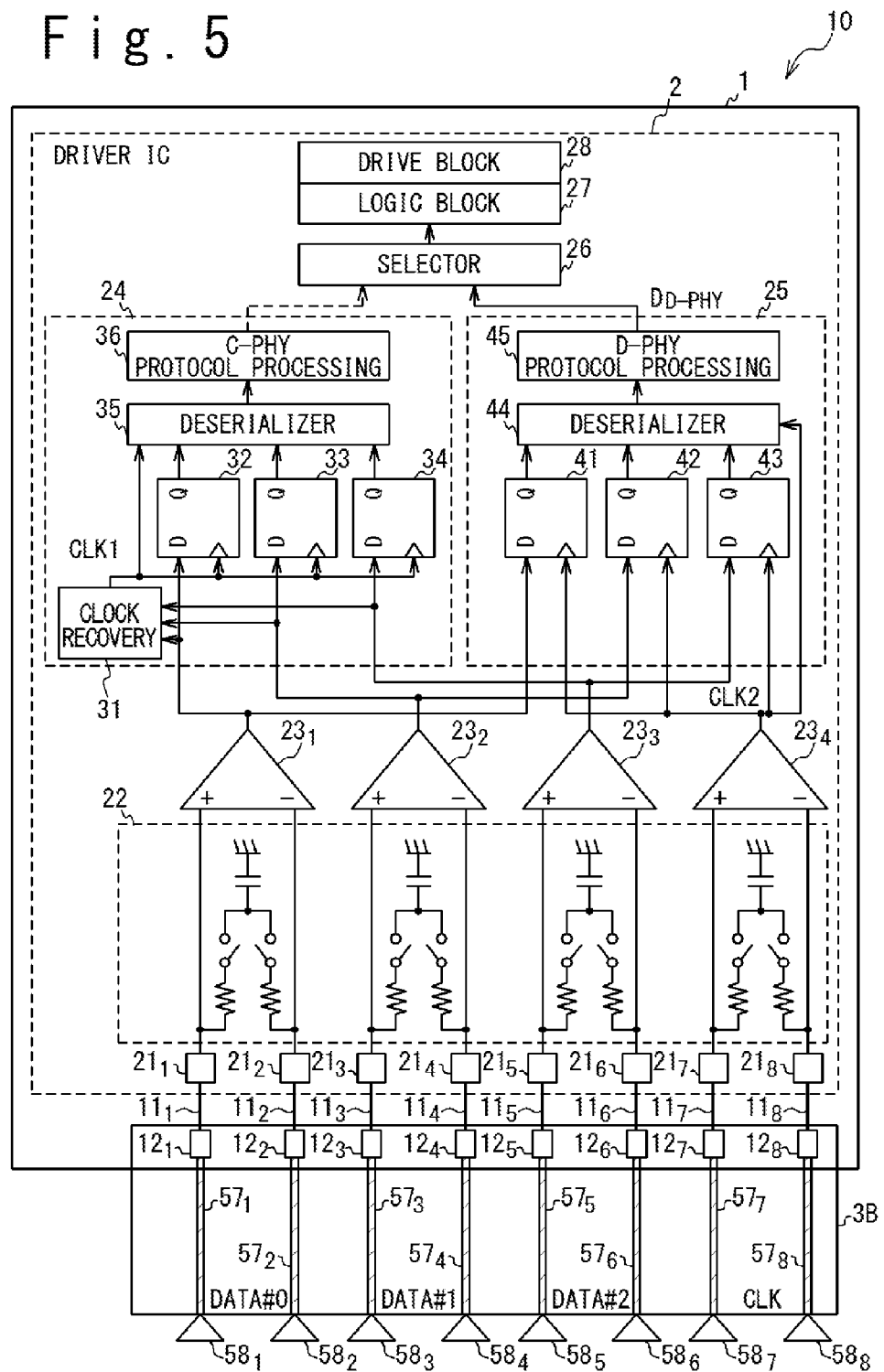
FIG. 5 is a block diagram illustrating an exemplary implementation in which the driver IC illustrated in FIG. 4 is applied to a display module which performs communications in accordance with the MIPI D-PHY specification.

FIG. 5 illustrates an exemplary implementation in which the driver IC 2 illustrated in FIG. 4 is applied to a display module which performs communications in accordance with the MIPI D-PHY specification. The flexible circuit board 3B includes transmission lines $57_1$ to $57_8$ used for communications in accordance with the MIPI D-PHY specification. The transmission lines $57_1$ and $57_2$ are used as data lane #0 and the transmission lines $57_3$ and $57_4$ are used as data lane #1. The transmission lines $57_5$ and $57_6$ are used as data lane #2 and the transmission lines $57_7$ and $57_8$ are used as the clock lane. The transmission lines $57_1$ to $57_8$ are connected to the connection terminals $12_1$ to $12_8$ of the liquid crystal display panel 1, respectively.

The differential data signals transmitted over data lanes #0 to #2 are converted into binary single-ended signals by the receivers $23_1$ to $23_3$, respectively. The single-ended signals output from the receivers $23_1$ to $23_3$ are latched by the flipflops 41 to 43, respectively, in synchronization with the clock signal CLK2 generated by the receiver $23_4$, and the data streams output from the flipflops 41 to 43 are processed by the deserializer 44 and the D-PHY protocol processing circuit 45 to generate the reception data $D_{D\text{-}PHY}$. The D-PHY block 25 is selected by the selector 26 and thereby the reception data $D_{D\text{-}PHY}$ generated by the D-PHY block 25 are supplied to the logic block 27. The above-described operation effectively achieves communications in accordance with the MIPI D-PHY specification.

It should be noted that, when the driver IC 2 illustrated in FIG. 4 is applied to a display module which performs communications in accordance with the MIPI C-PHY specification, the transmission line 51 is connected to the connection terminals $12_1$ and $12_4$, the transmission line 52 is connected to the connection terminals $12_2$ and $12_5$ and the transmission line 53 is connected to the connection terminals $12_3$ and $12_6$, similarly to the configuration illustrated in FIG. 3A.

Figure 6:
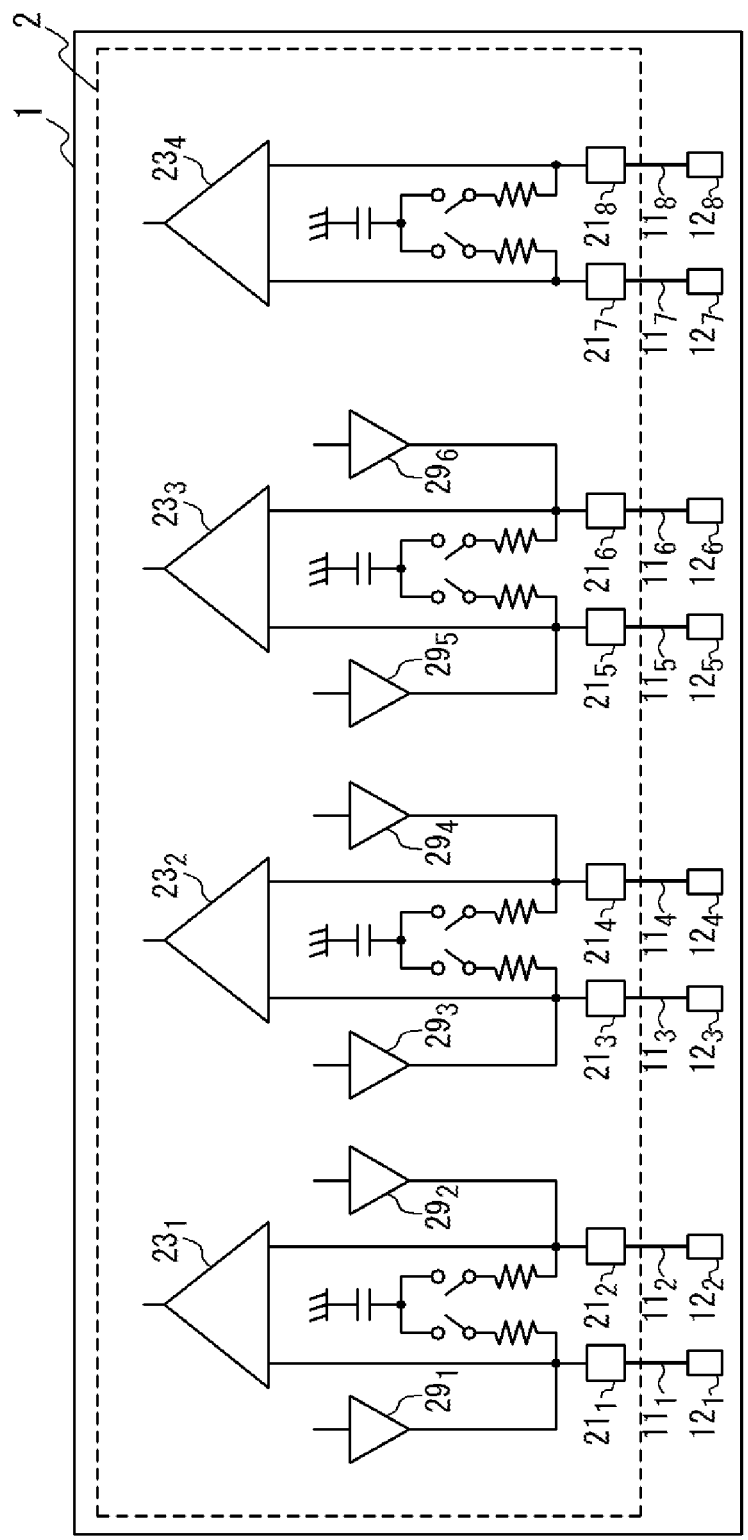
FIG. 6 is a block diagram partially illustrating an exemplary configuration of a driver IC adapted to bidirectional communications.

In the communication in accordance with the MIPI D-PHY specification, bidirectional communications may be implemented over a data lane. In this case, a transmitter is connected to the external connection terminal connected to the data lane. FIG. 6 partially illustrates the configuration of a driver IC 2 thus configured. Similarly to the driver IC 2 illustrated in FIG. 4, the driver IC 2 illustrated in FIG. 6 is configured so that the receivers $23_1$ to $23_3$ are respectively connected to the data lanes and the receiver $23_4$ is connected to the clock lane, when the communications are performed in accordance with the MIPI D-PHY specification. To achieve bidirectional communications over the data lanes, transmitters $29_1$ to $29_6$ are connected to the external connection terminals $21_1$ to $21_6$, respectively.

Figure 7A:
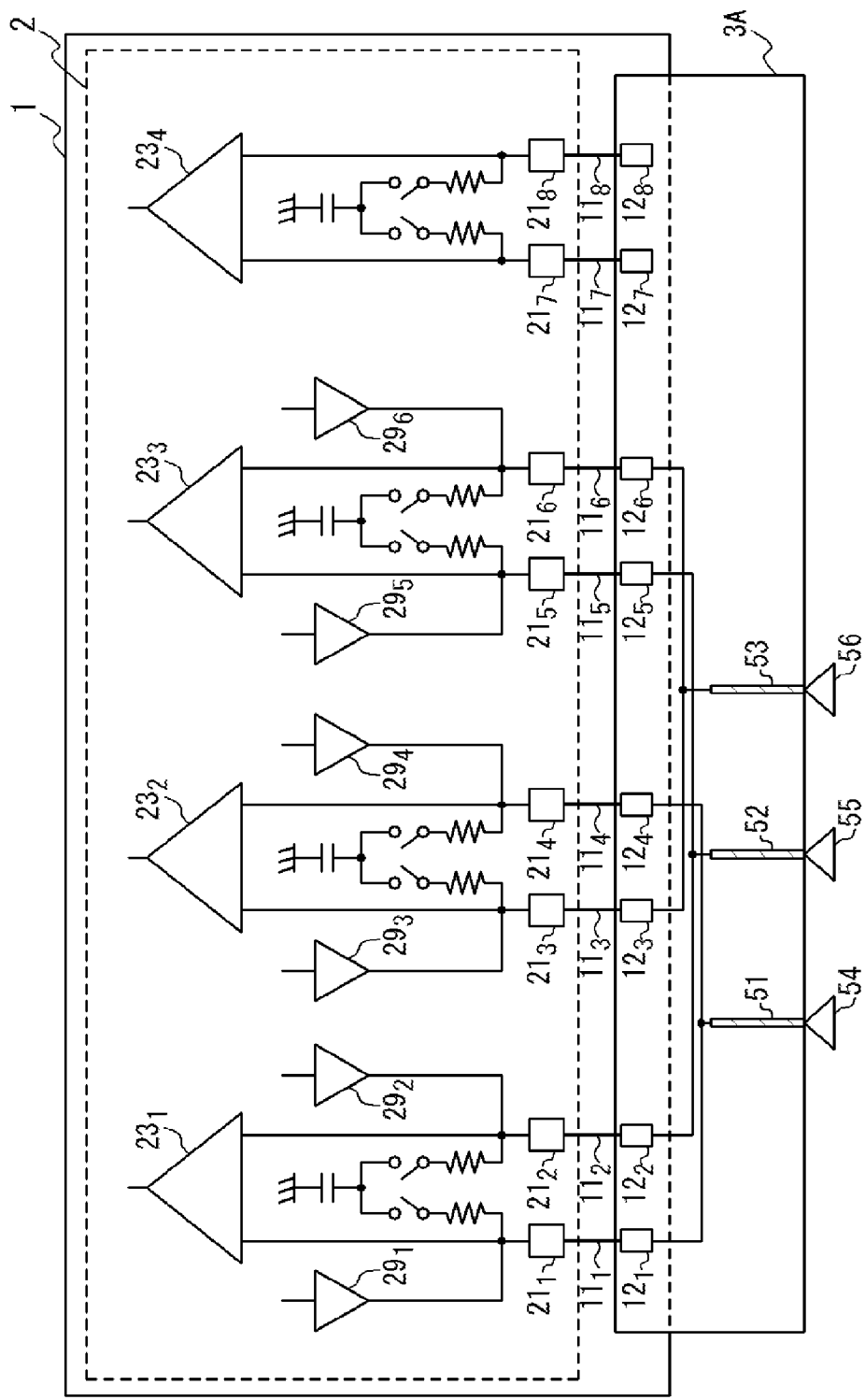
FIG. 7A is a block diagram illustrating an exemplary implementation in which the driver IC illustrated in FIG. 6 is applied to a display module which performs communications in accordance with the MIPI C-PHY specification.

When the driver IC 2 illustrated in FIG. 6 is applied to a display module which performs communications in accordance with the MIPI C-PHY specification, three of the transmitters $29_1$ to $29_6$ may be used for bidirectional communications. FIG. 7A illustrates an exemplary implementation in which the driver IC 2 illustrated in FIG. 6 is applied to a display module which achieves communications in accordance with the MIPI C-PHY specification. The transmission line 51 is connected to the external connection terminals $21_1$ and $21_4$, and the external connection terminals $21_1$ and $21_4$ are connected to the transmitters $29_1$ and $29_4$, respectively. Similarly, the transmission line 52 is connected to the external connection terminals $21_2$ and $21_5$, and the external connection terminals $21_2$ and $21_5$ are connected to the transmitters $29_2$ and $29_5$, respectively. Furthermore, the transmission line 53 is connected to the external connection terminals $21_3$ and $21_6$, and the external connection terminals $21_3$ and $21_6$ are connected to the transmitters $29_3$ and $29_6$, respectively. When the communications are performed in accordance with the MIPI C-PHY specification, one of the transmitters $29_1$ and $29_4$ is activated, one of the transmitters $29_2$ and $29_5$ is activated, and one of the transmitters $29_3$ and $29_5$ is activated. Signals are transmitted from the driver IC 2 to an external entity by the three activated transmitters.

Figure 7B:
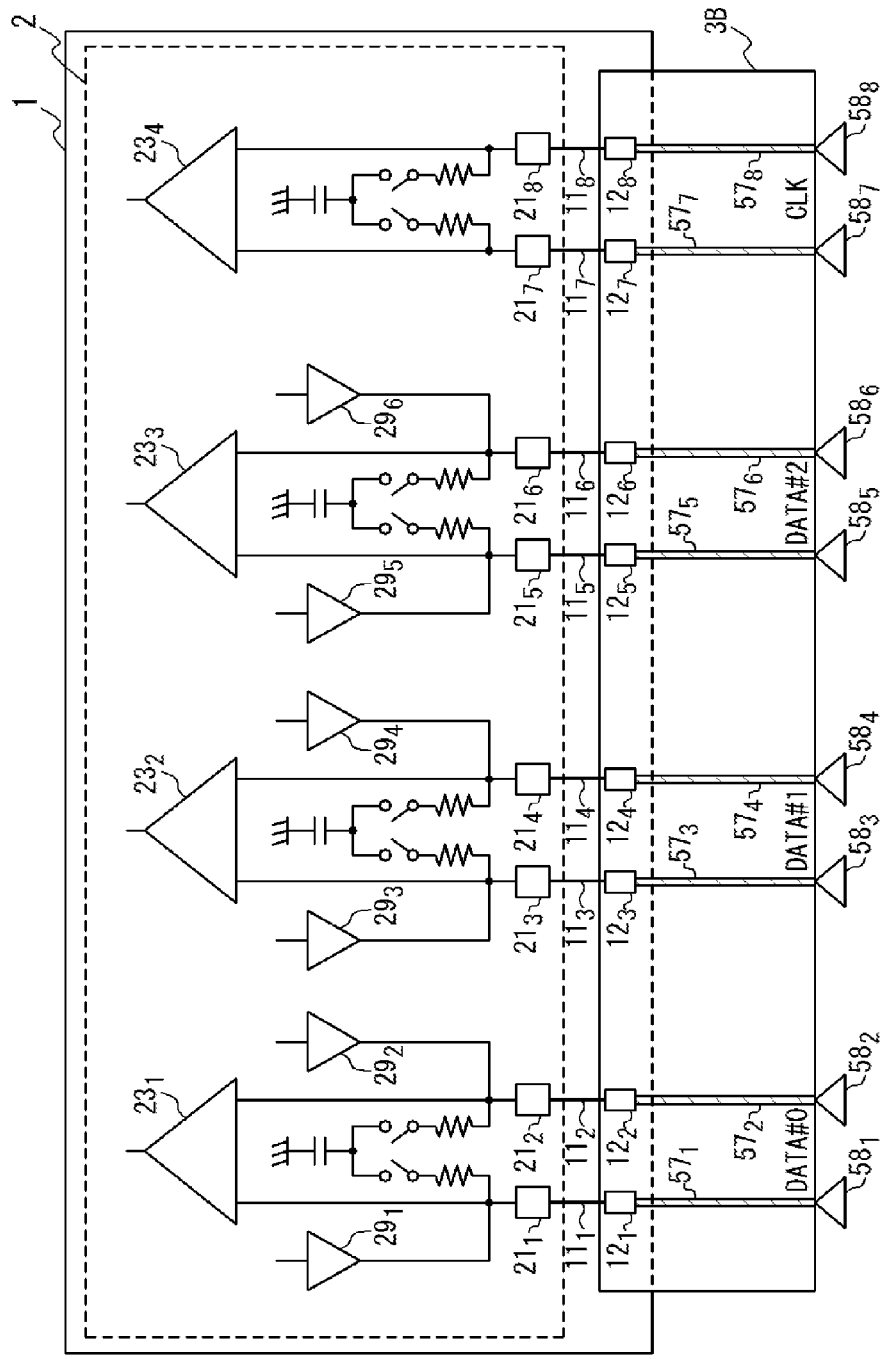
FIG. 7B is a block diagram illustrating an exemplary implementation in which the driver IC illustrated in FIG. 6 is applied to a display module which performs communications in accordance with the MIPI D-PHY specification.

FIG. 7B, on the other hand, illustrates an exemplary implementation in which the driver IC 2 illustrated in FIG. 6 is applied to a display module which performs communications in accordance with the MIPI D-PHY specification. The transmission lines $57_1$ to $57_8$ are connected to the external connection terminals $21_1$ to $21_8$, respectively. The transmission lines $57_1$ and $57_2$ are used as data lane #0, and the transmission lines $57_3$ and $57_4$ are used as data lane #1. The transmission lines $57_5$ and $57_6$ are used as data lane #2, and the transmission lines $57_7$ and $57_8$ are used as the clock lane. When the communications are performed in accordance with the MIPI D-PHY specification, signals are transmitted from the driver IC 2 to an external entity over data lanes #0 to #2, by the transmitters $29_1$ to $29_6$.

Configuration and Operation of Terminal Resistor Circuit

One issue which may be raised in the case when the above-described driver ICs 2 are applied to both of a display module which performs communications in accordance with the MIPI C-PHY specification and a display module which performs communications in accordance with the MIPI D-PHY specification is that the terminal resistor connection recommended by the MIPI C-PHY specification is different from that recommended by the MIPI D-PHY specification. The MIPI C-PHY specification recommends that the three transmission lines be respectively connected to terminal resistors of 50Ω with a Y-connection, while the MIPI D-PHY specification recommends that the pair of transmission lines of each lane be connected by a terminal resistor of 100Ω. It would be advantageous if the terminal resistor circuit 22 connected to the external connection terminals $21_1$ to $21_6$ is configured to satisfy the recommendations of both of the MIPI C-PHY and D-PHY specifications. In the following, a description is given of preferred configurations and operations of the terminal resistor circuit 22.

Figure 8:
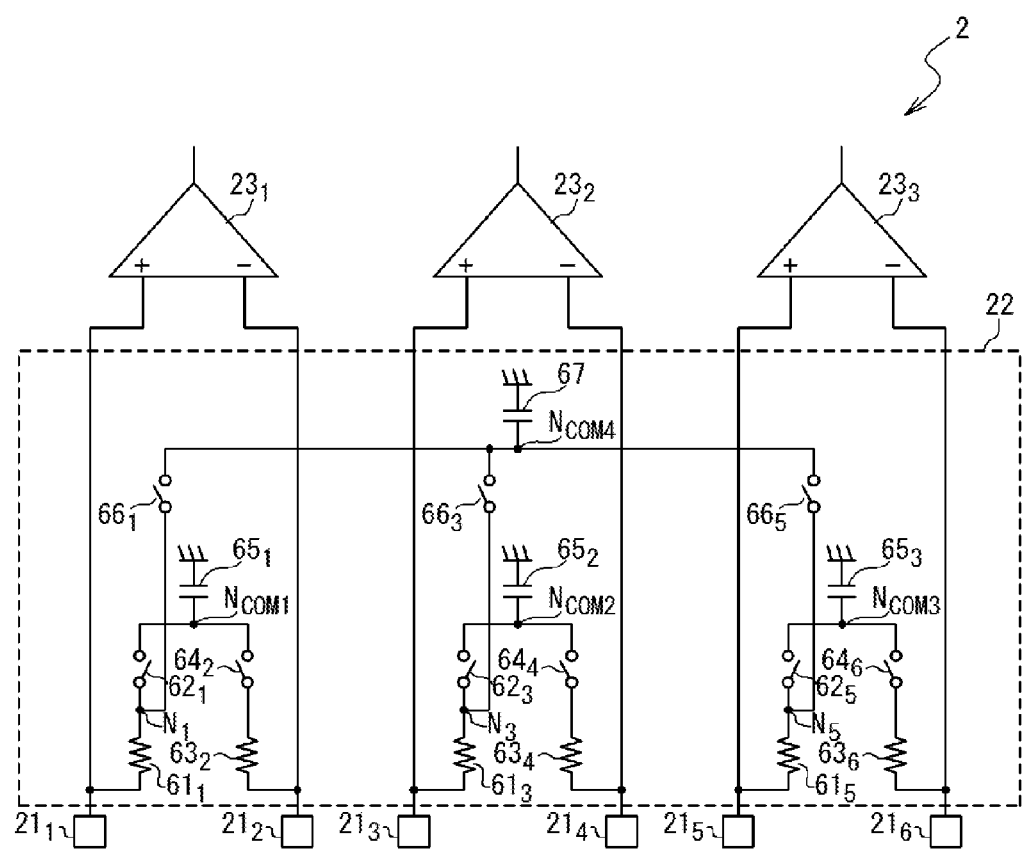
FIG. 8 is a circuit diagram illustrating an exemplary configuration of a terminal resistor circuit in one embodiment.

FIG. 8 is a circuit diagram illustrating an exemplary configuration of the terminal resistor circuit 22 in one embodiment. The terminal resistor circuit 22 includes resistor elements $61_1$, $61_3$, $61_5$, switches $62_1$, $62_3$, $62_5$, resistor elements $63_2$, $63_4$, $63_6$, switches $62_2$, $62_4$, $62_5$, capacitors $65_1$, $65_2$, $65_3$, switches $66_1$, $66_3$, $66_5$, and a C-PHY capacitor 67. In a preferred embodiment, the resistor elements $61_1$, $61_3$, $61_5$, $63_2$, $63_4$ and $63_6$ each have a resistance of 50Ω.

The capacitors $65_1$, $65_2$ and $65_3$ are connected between the circuit ground and common connection nodes $N_{COM1}$, $N_{COM2}$ and $N_{COM3}$, respectively. The common connection nodes $N_{COM1}$, $N_{COM2}$ and $N_{COM3}$ are AC-grounded via the capacitors $65_1$, $65_2$ and $65_3$, respectively. The C-PHY capacitor 67 is connected between a common connection node $N_{COM4}$ and the circuit ground. The common connection node $N_{COM4}$ is AC-grounded via the C-PHY capacitor 67.

The resistor element $61_1$ is connected between the external connection terminal $21_1$ and a node $N_1$, and the switch $62_1$ is connected between the node $N_1$ and the common connection node $N_{COM1}$. The resistor element $63_2$ and the switch $64_2$ are connected in series between the external connection terminal $21_2$ and the common connection node $N_{COM1}$. The resistor element $61_3$ is connected between the external connection terminal $21_3$ and a node $N_3$, and the switch $62_3$ is connected between the node $N_3$ and the common connection node $N_{COM2}$. The resistor element $63_4$ and the switch $64_4$ are connected in series between the external connection terminal $21_4$ and the common connection node $N_{COM2}$. The resistor element $61_5$ is connected between the external connection terminal $21_5$ and a node $N_5$, and the switch $62_5$ is connected between the node $N_5$ and the common connection node $N_{COM3}$. The resistor element $63_6$ and the switch $64_6$ are connected in series between the external connection terminal $21_6$ and the common connection node $N_{COM3}$.

Finally, the switches $66_1$, $66_3$ and $66_5$ are connected between the common connection node $N_{COM4}$ and the nodes $N_1$, $N_3$ and $N_5$, respectively.

The terminal resistor circuit 22 thus configured can provide the terminal resistor connection recommended by the MIPI C-PHY specification and that recommended by the MIPI D-PHY specification by properly setting the on/off states of the switches $62_1$, $62_3$, $62_5$, $64_2$, $64_2$, $64_6$, $66_1$, $66_3$ and $66_5$.

Figure 9A:
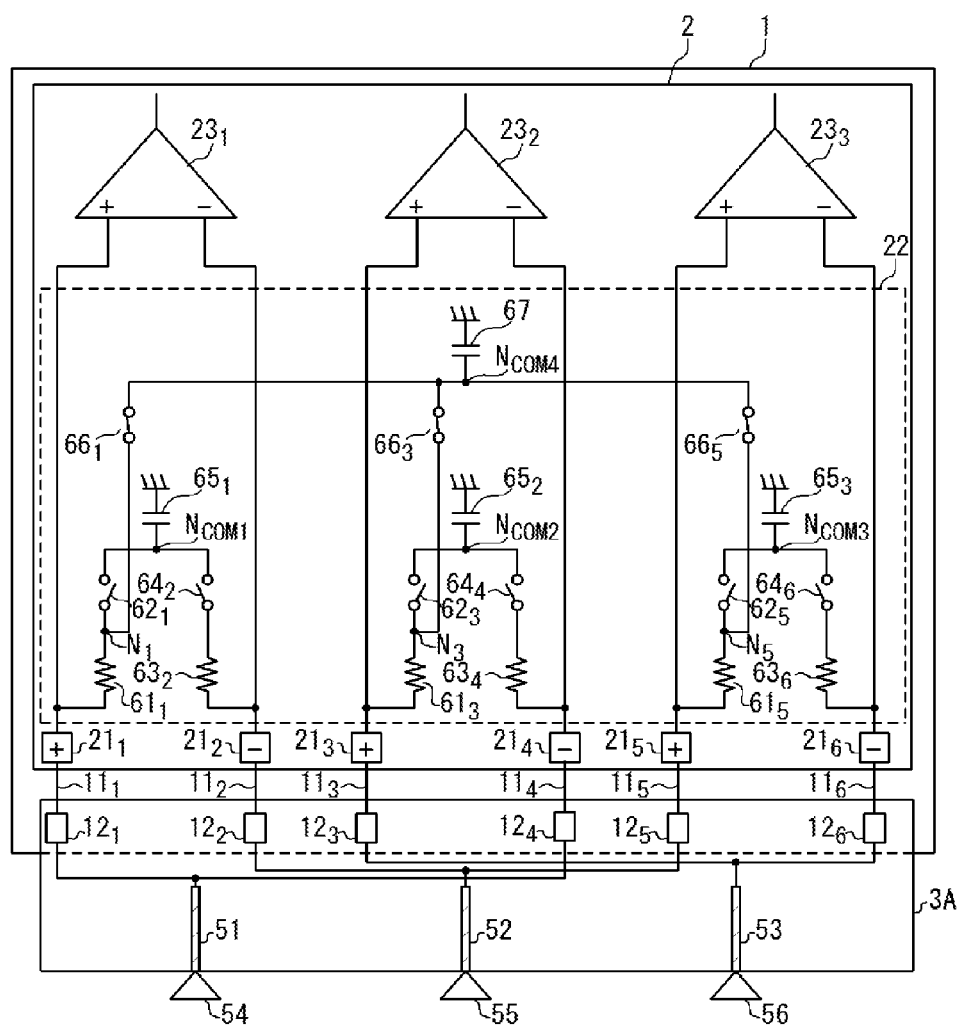
FIG. 9A illustrates an exemplary setting of the terminal resistor circuit illustrated in FIG. 8, when the driver IC incorporating the terminal resistor circuit is applied to a display module which performs communications in accordance with the MIPI C-PHY specification.

FIG. 9A illustrates an exemplary setting of the terminal resistor circuit 22 illustrated in FIG. 8, in the case when the driver IC 2 performs communications in accordance with the MIPI C-PHY specification. As described above, when the driver IC 2 performs communications in accordance with the MIPI C-PHY specification, the transmission line 51 disposed on the flexible circuit board 3A is connected to the external connection terminals $21_1$ and $21_4$, the transmission line 52 is connected to the external connection terminals $21_2$ and $21_5$, and the transmission line 53 is connected to the external connection terminals $21_3$ and $21_6$.

When the driver IC 2 performs communications in accordance with the MIPI C-PHY specification, the switches $66_1$, $66_3$ and $66_5$ are turned on, and the switches $62_1$, $62_3$, $62_5$, $64_2$, $64_4$ and $64_6$ are turned off. This setting allows the resistor elements $61_1$, $61_3$ and $61_5$ are commonly connected to the common connection node $N_{COM4}$. This leads to that the resistor elements $61_1$, $61_3$ and $61_5$ are connected to the transmission lines 51, 52 and 53 with a Y-connection, as recommended by the MIPI C-PHY specification. It would be preferable that the resistor elements $61_1$, $61_3$ and $61_5$ each have a resistance of 50Ω, since this offers a Y-connection of terminal resistors of 50Ω, as recommended by the MIPI C-PHY specification.

Figure 9B:
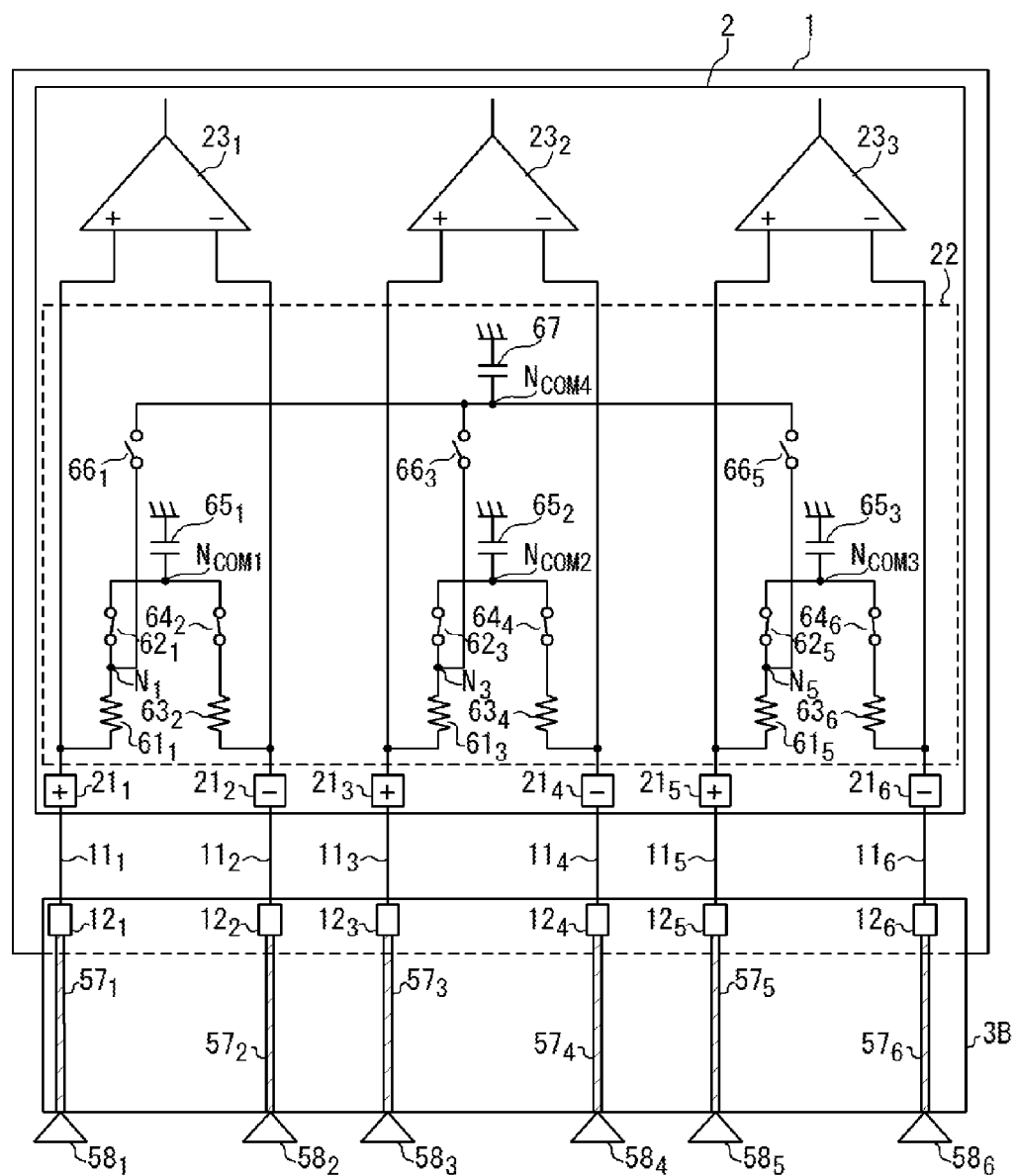
FIG. 9B illustrates an exemplary setting of the terminal resistor circuit illustrated in FIG. 8, when the driver IC incorporating the terminal resistor circuit is applied to a display module which performs communications in accordance with the MIPI D-PHY specification.

FIG. 9B, on the other hand, illustrates an exemplary setting of the terminal resistor circuit 22, in the case when the driver IC 2 performs communications in accordance with the MIPI D-PHY specification. As described above, when the driver IC 2 performs communications in accordance with the MIPI D-PHY specification, the transmission lines $57_1$ to $57_6$ disposed on the flexible circuit board 3B are connected to the external connection terminals $21_1$ to $21_6$, respectively.

When the driver IC 2 performs communications in accordance with the MIPI D-PHY specification, the switches $62_1$, $62_3$, $62_5$, $64_2$, $64_4$ and $64_6$ are turned on, and the switches $66_1$, $66_3$ and $66_5$ are turned off. This setting allows connecting the external connection terminals $21_1$ and $21_2$ via the resistors $61_1$ and $63_2$, connecting the external connection terminals $21_3$ and $21_4$ via the resistors $61_3$ and $63_4$, and connecting the external connection terminals $21_5$ and $21_6$ via the resistors $61_5$ and $63_6$. This leads to that the transmission lines $57_1$ and $57_2$ are connected via the resistor elements $61_1$ and $63_2$, the transmission lines $57_3$ and $57_4$ are connected via the resistor elements $61_3$ and $63_4$, and the transmission lines $57_5$ and $57_6$ are connected via the resistor elements $61_5$ and $63_6$. Such connections are in accordance with the recommendation by the MIPI D-PHY specification. It would be preferable that the resistor elements $61_1$, $61_3$, $61_5$, $63_2$, $63_4$ and $63_6$ each have a resistance of 50Ω, since this results in that each pair of external connection terminals 21 are connected via a terminal resistor of 100Ω, as recommended by the MIPI D-PHY specification. It should be noted that, if the resistor elements $61_1$, $61_3$ and $61_5$ each have a resistance of 50Ω, this concurrently satisfies the recommendation by the MIPI C-PHY specification.

In the circuit configuration illustrated in FIG. 8, there is a difference in the circuit element connection between the non-inverting inputs (+) and inverting inputs (−) of the receivers $23_1$, $23_2$ and $23_3$, and this difference may cause unbalancing between the non-inverting inputs and inverting inputs. This is not preferable for reception of differential signals.

Figure 10:
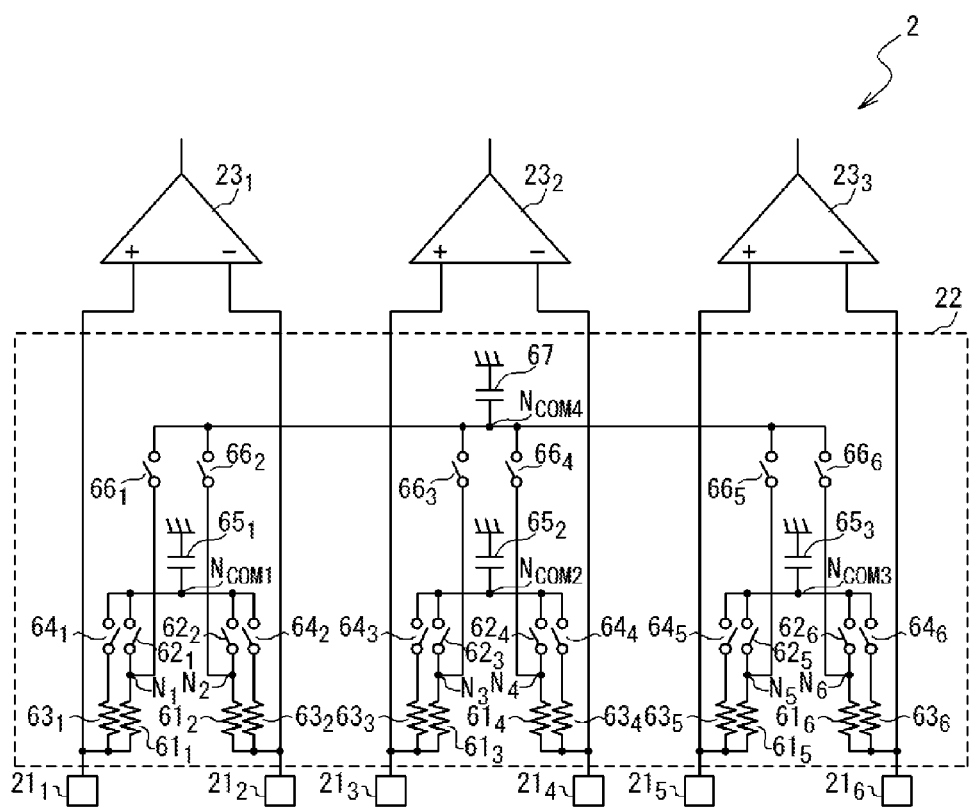
FIG. 10 is a circuit diagram illustrating an exemplary configuration of a resistor element circuit in another embodiment.

FIG. 10 is a circuit diagram illustrating another exemplary configuration of the terminal resistor circuit 22 for addressing the issue of the balance between the non-inverting and inverting inputs. The terminal resistor circuit 22 illustrated in FIG. 10 includes resistor elements $61_1$ to $61_6$, switches $62_1$ to $62_6$, resistor elements $63_1$ to $63_6$, switches $64_1$ to $64_6$, capacitors $65_1$ to $65_3$, switches $66_1$ to $66_6$, and a C-PHY capacitor 67. In one preferred embodiment, the resistor elements $61_1$ to $61_6$ and $63_1$ to $63_6$ each have a resistance of 100Ω.

The capacitors $65_1$, $65_2$ and $65_3$ are connected between the circuit ground and common connection nodes $N_{COM1}$, $N_{COM2}$ and $N_{COM3}$, respectively. The common connection nodes $N_{COM1}$, $N_{COM2}$ and $N_{COM3}$ are AC-grounded via the capacitors $65_1$, $65_2$ and $65_3$, respectively. The C-PHY capacitor 67 is connected between a common connection node $N_{COM4}$ and the circuit ground. The common connection node $N_{COM4}$ is AC-grounded via the C-PHY capacitor 67.

The circuit element connections related to the external connection terminal $21_1$ are as follows: The resistor element $61_1$ is connected between the external connection terminal $21_1$ and a node $N_1$, and the switch $62_1$ is connected between the node $N_1$ and the common connection node $N_{COM1}$. The resistor element $63_1$ and the switch $64_1$ are connected in series between the external connection terminal $21_1$ and the common connection node $N_{COM1}$. It should be noted that the resistor element $63_1$ and the switch $64_1$ are connected in parallel to the resistor elements $61_1$ and the switch $62_1$.

The similar goes for the other external connection terminals. The resistor element $61_2$ is connected between the external connection terminal $21_2$ and a node $N_2$ and the switch $62_2$ is connected between the node $N_2$ and the common connection node $N_{COM1}$. The resistor element $63_2$ and the switch $64_2$ are connected in series between the external connection terminal $21_2$ and the common connection node $N_{COM1}$. It should be noted that the resistor element $63_2$ and the switch $64_2$ are connected in parallel to the resistor elements $61_2$ and switch $62_2$.

The resistor element $61_3$ is connected between the external connection terminal $21_3$ and a node $N_3$ and the switch $62_3$ is connected between the node $N_3$ and the common connection node $N_{COM2}$. The resistor element $63_3$ and the switch $64_3$ are connected in series between the external connection terminal $21_3$ and the common connection node $N_{COM2}$.

The resistor element $61_4$ is connected between the external connection terminal $21_4$ and a node $N_4$ and the switch $62_4$ is connected between the node $N_4$ and the common connection node $N_{COM2}$. The resistor element $63_4$ and the switch $64_4$ are connected in series between the external connection terminal $21_4$ and the common connection node $N_{COM2}$.

The resistor element $61_5$ is connected between the external connection terminal $21_5$ and a node $N_5$ and the switch $62_5$ is connected between the node $N_5$ and the common connection node $N_{COM3}$. The resistor element $63_5$ and the switch $64_5$ are connected in series between the external connection terminal $21_5$ and the common connection node $N_{COM3}$.

The resistor element $61_6$ is connected between the external connection terminal $21_6$ and a node $N_6$ and the switch $62_6$ is connected between the node $N_6$ and the common connection node $N_{COM3}$. The resistor element $63_6$ and the switch $64_6$ are connected in series between the external connection terminal $21_6$ and the common connection node $N_{COM3}$.

Finally, the switches $66_1$ to $66_6$ are connected between the common connection node $N_{COM4}$ and the nodes $N_1$ to $N_6$, respectively.

Figure 11A:
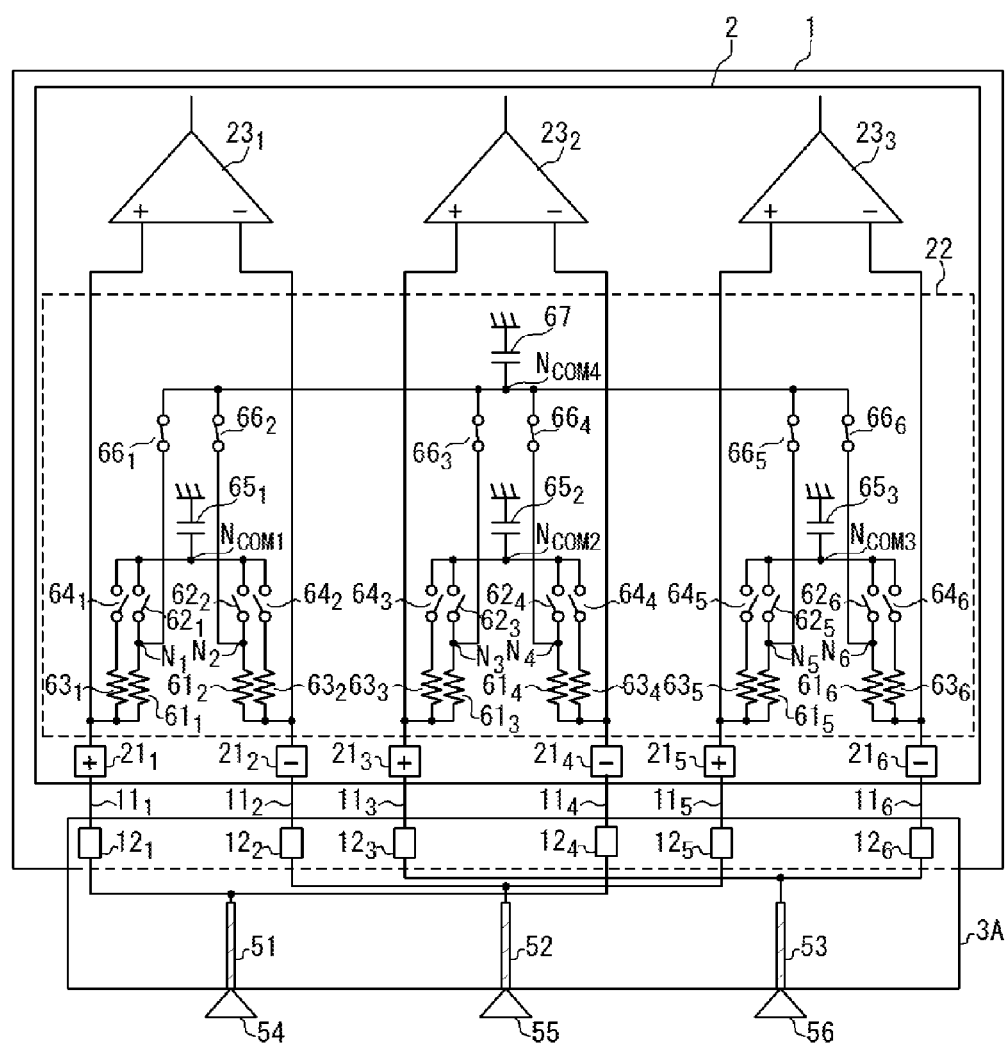
FIG. 11A illustrates an exemplary setting of the terminal resistor circuit illustrated in FIG. 10, when the driver IC incorporating the terminal resistor circuit is applied to a display module which performs communications in accordance with the MIPI C-PHY specification.

FIG. 11A illustrates an exemplary setting of the terminal resistor circuit 22 illustrated in FIG. 10, in the case when the driver IC 2 performs communications in accordance with the MIPI C-PHY specification. As described above, when the driver IC 2 performs communications in accordance with the MIPI C-PHY specification, the transmission line 51 disposed on the flexible circuit board 3A is connected to the external connection terminals $21_1$ and $21_4$, the transmission line 52 is connected to the external connection terminals $21_2$ and $21_5$, and the transmission line 53 is connected to the external connection terminals $21_3$ and $21_6$.

When the driver IC 2 performs communications in accordance with the MIPI C-PHY specification, the switches $66_1$ to $66_6$ are turned on, and the switches $62_1$ to $62_6$, and $64_1$ to $64_6$ are turned off. This setting allows the resistor elements $61_1$ to $61_6$ are commonly connected to the common connection node $N_{COM4}$. It should be noted that the resistor elements $61_1$ and $61_4$ are electrically connected in parallel between the transmission line 51 and the common connection node $N_{COM4}$. Similarly, the resistor elements $61_2$ and $61_5$ are electrically connected in parallel between the transmission line 52 and the common connection node $N_{COM4}$, and the resistor elements $61_3$ and $61_6$ are electrically connected in parallel between the transmission line 53 and the common connection node $N_{COM4}$. As a result, terminal resistors are connected to the transmission lines 51, 52 and 52 with a Y-connection, as recommended by the MIPI C-PHY specification. It would be preferable that the resistor elements $61_1$, $61_3$ and $61_5$ each have a resistance of 100Ω, since this offers a Y-connection of terminal resistors of 50Ω between the transmission lines 51, 52, 53 and the common connection node $N_{COM4}$, as recommended by the MIPI C-PHY specification.

Figure 11B:
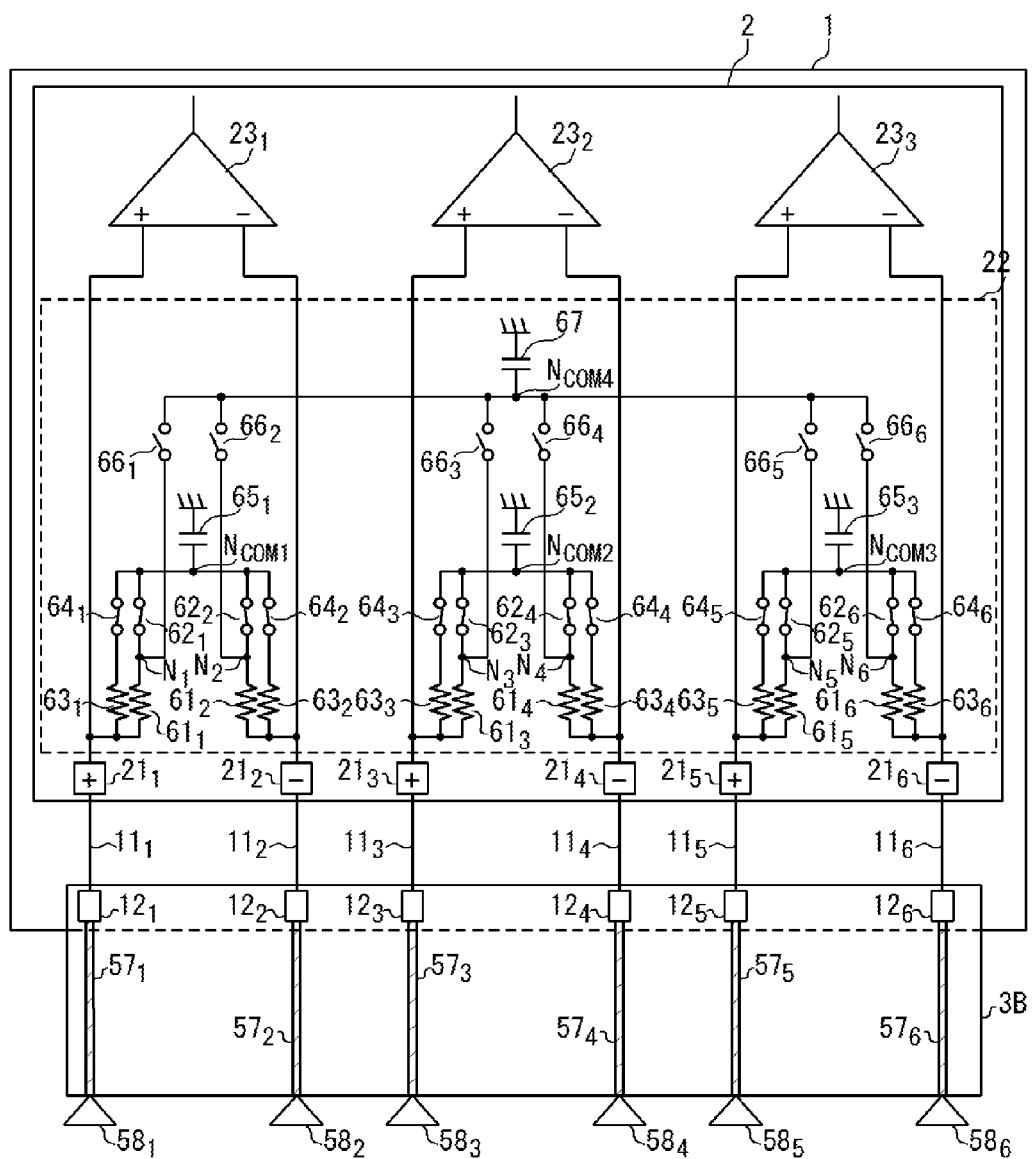
FIG. 11B illustrates an exemplary setting of the terminal resistor circuit illustrated in FIG. 10, when the driver IC incorporating the terminal resistor circuit is applied to a display module which achieves communications in accordance with the MIPI D-PHY specification.

FIG. 11B illustrates an exemplary setting of the terminal resistor circuit 22 illustrated in FIG. 10, in the case when the driver IC 2 performs communications in accordance with the MIPI D-PHY specification. As described above, when the driver IC 2 performs communications in accordance with the MIPI D-PHY specification, the transmission lines $57_1$ to $57_6$ disposed on the flexible circuit board 3B are connected to the external connection terminals $21_1$ to $21_6$, respectively.

When the driver IC 2 performs communications in accordance with the MIPI D-PHY specification, the switches $62_1$ to $62_6$ and $64_1$ to $64_6$ are turned on, and the switches $66_1$ to $66_6$ are turned off. This setting allows connecting the external connection terminals $21_1$ and $21_2$ via the resistors $61_1$, $61_2$, $63_1$ and $63_2$, connecting the external connection terminals $21_3$ and $21_4$ via the resistors $61_3$, $61_4$, $63_3$ and $63_4$, and connecting the external connection terminals $21_5$ and $21_6$ via the resistors $61_5$, $61_6$, $63_5$ and $63_5$. In other words, the transmission lines $57_1$ and $57_2$ are connected via the resistor elements $61_1$, $61_2$, $63_1$ and $63_2$, the transmission lines $57_3$ and $57_4$ are connected via the resistor elements $61_3$, $61_4$, $63_3$ and $63_4$, and the transmission lines $57_5$ and $57_6$ are connected via the resistor elements $61_5$, $61_6$, $63_5$ and $63_6$. Such connections are in accordance with the recommendation by the MIPI D-PHY specification. It would be preferable that the resistor elements $61_1$ to $61_6$ and $63_1$ to $63_6$ each have a resistance of 100Ω, since this results in that each pair of external connection terminals 21 are connected via a terminal resistor of 100Ω, as recommended by the MIPI D-PHY specification. It should be noted that, if the resistor elements $61_1$ to $61_6$ each have a resistance of 100Ω, this concurrently satisfies the recommendation by the MIPI C-PHY specification.

Routing of Interconnections on Liquid Crystal Display Panel and Flexible Circuit Board When the communications are performed in accordance with the MIPI C-PHY specification, as illustrated in FIG. 3A, for example, each transmission line (51, 52 and 53) is connected to two connection terminals 12 of the liquid crystal display panel 1. In this case, when interconnections are routed on the flexible circuit board 3A as illustrated in FIG. 3A, for example, interconnections that connects each transmission line (51, 52, 53) to the corresponding two connection terminals 12 of the liquid crystal display panel 1 intersect with one another. Such intersections may cause deterioration in the performance of the communication in accordance with the MIPI C-PHY specification. As discussed below in detail, this problem can be effectively resolved by properly designing the routing of interconnections formed on the liquid crystal display panel and the flexible circuit board.

Figure 12A:
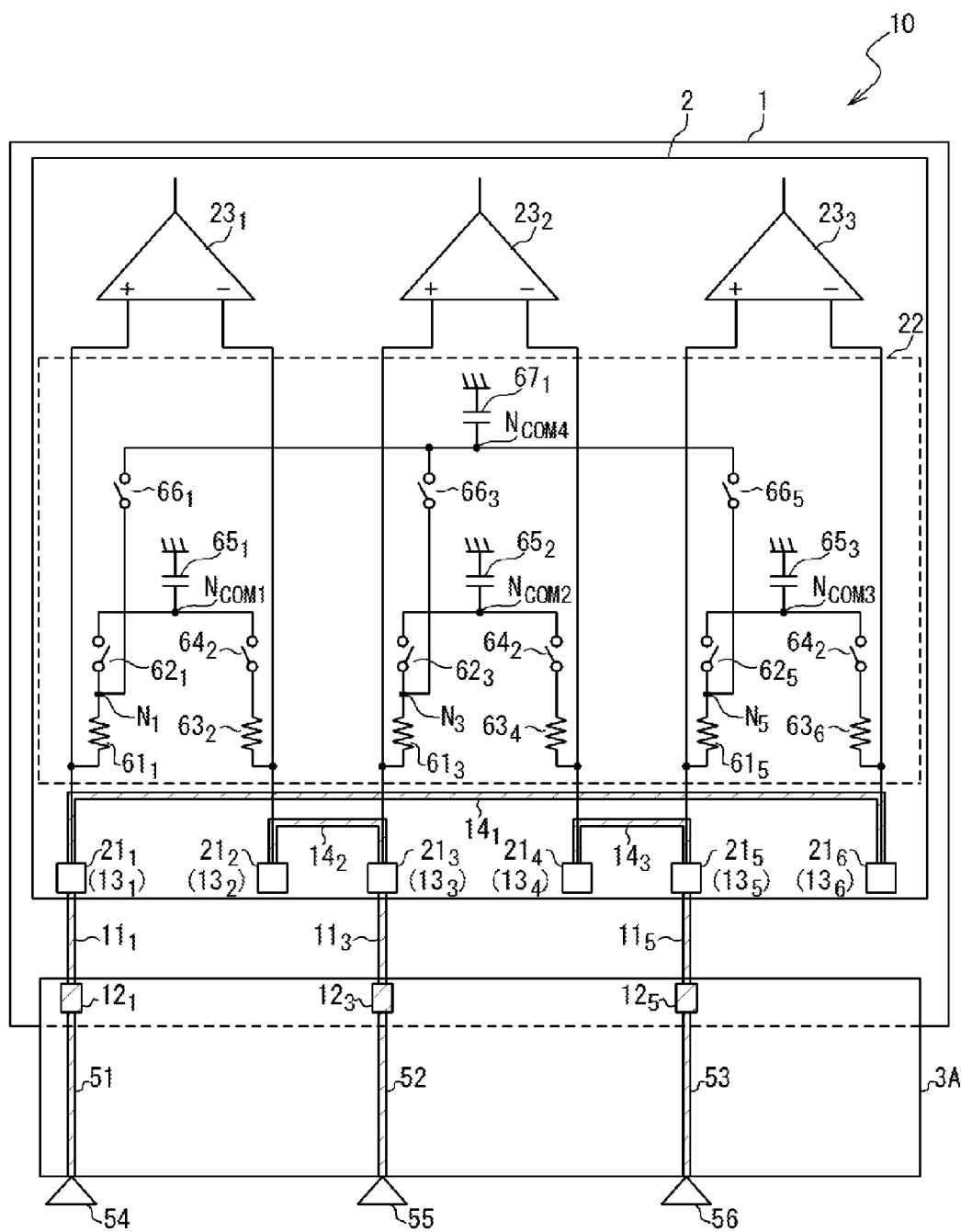
FIG. 12A is a conceptual diagram illustrating an exemplary configuration of a display module designed to avoid an intersection of interconnections on a flexible circuit board.
Figure 12B:
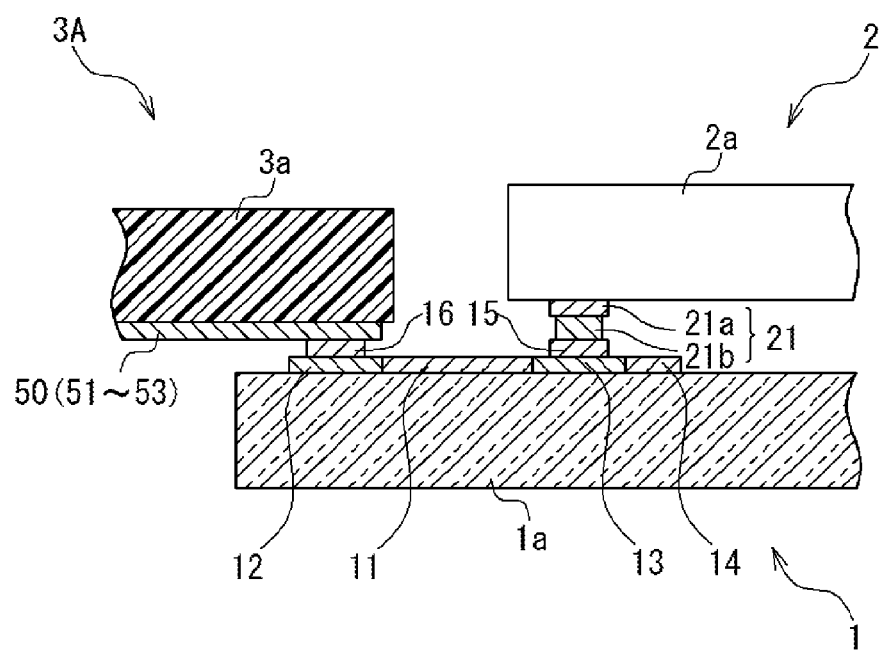
FIG. 12B is a section view conceptually illustrating one example of connection structures between a liquid crystal display panel and a driver IC and between the liquid crystal display panel and the flexible circuit board.
Figure 12C:
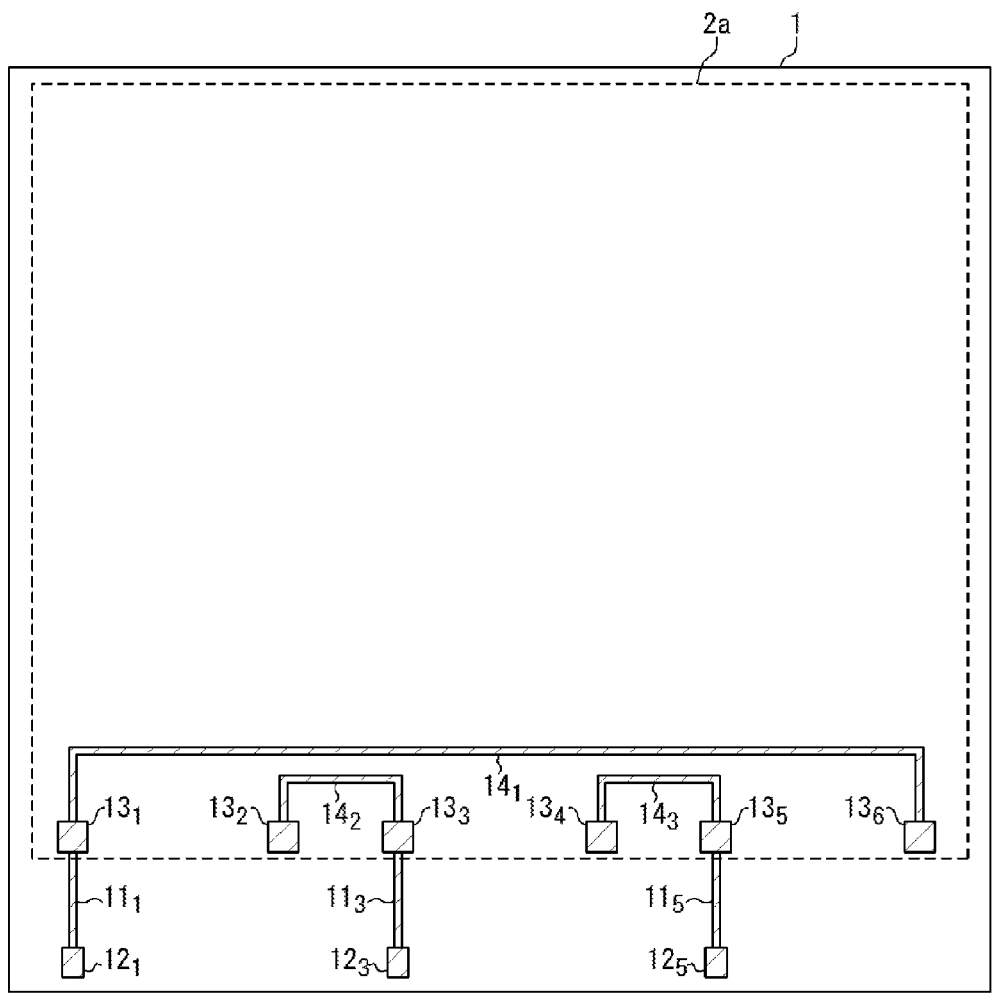
FIG. 12C is a plan view illustrating an exemplary routing of interconnections formed on the liquid crystal display panel.

FIG. 12A to 12C are conceptual diagrams illustrating an exemplary configuration of a display module 10 designed to avoid an intersection of interconnections on the flexible circuit board 3A. One feature of the configuration illustrated in FIGS. 12A to 12C is that each of the connection terminals 12 to be connected to the transmission lines 51, 52 and 53 are connected to the corresponding two external connection terminals 22 of the driver IC 2 via an interconnection disposed on the liquid crystal display panel 1. This configuration effectively avoid an intersection of interconnections on the flexible circuit board 3A, since each of the transmission lines 51, 52 and 53 is connected to desired two of the external connection terminals 21 via an interconnection formed on the liquid crystal display panel 1, only by connecting each of the transmission lines 51, 52 and 53 to the single corresponding connection terminals 12 ($12_1$, $12_3$, $12_5$) of the liquid crystal display panel 1. In the following, a description is given of the configuration of the display module 10 illustrated in FIGS. 12A to 12C.

FIG. 12B is a section view conceptually illustrating one example of the connection structures between the liquid crystal display panel 1 and the driver IC 2 and between the liquid crystal display panel 1 and the flexible circuit board 3. Formed on the glass substrate 1a of the liquid crystal display panel 1 are interconnections 11, 14 and connection terminals 12 and 13. The external connection terminals 21 are formed on the semiconductor chip 2a of the driver IC 2. In the structure illustrated in FIG. 12B, each external connection terminal 21 includes a pad 21a and a bump 21b. Interconnections (including the transmission lines 51 to 53) are formed on a resin substrate 3a of the flexible circuit board 3A.

Each of the bumps 21b of the external connection terminals 21 of the driver IC 2 is bonded to the corresponding connection terminal 13 of the liquid crystal display panel 1 via a contact 15. An anisotropic conductive film (ACF) may be used as the contact 15, for example. Similarly, each of the interconnections 50 of the flexible circuit board 3A is bonded to the corresponding connection terminal 12 of the liquid crystal display panel 1 via a contact 16. An anisotropic conductive film may be used as the contact 16, for example.

FIG. 12C is a plan view illustrating the routing of the interconnections formed on the glass substrate 1a of the liquid crystal display panel 1. In FIG. 12C, the broken-line rectangle denoted by the numeral 2a indicates the region in which the driver IC 2 is mounted. In an application to a display module 10 which performs communications in accordance with the MIPI C-PHY specification, interconnections $11_1$, $11_3$, $11_5$, connection terminals $12_1$, $12_3$, $12_5$, $13_1$ to $13_6$ and interconnections $14_1$ to $14_3$ are formed on the glass substrate of the liquid crystal display panel 1. The connection terminals $12_1$, $12_3$ and $12_5$ are connected to the transmission lines 51, 52 and 53 of the flexible circuit board 3A for achieving communications in accordance with the MIPI C-PHY specification. The terminals $13_1$ to $13_6$ are connected to the external connection terminals $21_1$ to $21_6$ of the driver IC 2. The interconnections $11_1$, $11_3$ and $11_5$ are formed to connect the connection terminals $12_1$, $12_3$ and $12_5$ to the connection terminals $13_1$, $13_3$ and $13_5$, respectively. The interconnection $14_1$ is formed to connect the connection terminals $13_1$ and $13_6$, the interconnection $14_2$ is formed to connect the connection terminals $13_2$ and $13_3$, and the interconnection $14_3$ is formed to connect the connection terminals $13_4$ and $13_5$.

The use of the liquid crystal display panel 1 thus structured allows electrically connecting the transmission lines 51, 52 and 53 to the receivers $23_1$, $23_2$ and $23_3$ of the driver IC 2 in performing communications in accordance with the MIPI C-PHY specification, while avoiding an intersection of interconnections on the flexible circuit board 3A. More specifically, to achieve communications in accordance with the MIPI C-PHY specification, as illustrated in FIG. 12A, the transmission lines 51, 52 and 53 formed on the flexible circuit board 3A are connected to the connection terminals $12_1$, $12_3$ and $12_5$ of the liquid crystal display panel 1, respectively, while the external connection terminals $21_1$ to $21_6$ of the driver IC 2 are connected to the connection terminals $13_1$ to $13_6$ of the liquid crystal display panel 1, respectively.

In this configuration, as illustrated in FIG. 12C, the connection terminals $13_1$ and $13_6$ formed on the liquid crystal display panel 1 are connected to each other via the interconnection $14_1$, and therefore the transmission line 51 is connected to the non-inverting input (+) of the receiver $23_1$ via the external connection terminal $21_1$ and further to the inverting input (−) of the receiver $23_3$ via the interconnection $14_1$ and the external connection terminal $21_6$. Similarly, the connection terminals $13_2$ and $13_3$ are connected each other via the interconnection $14_2$, and therefore the transmission line 52 is connected to the non-inverting input (+) of the receiver $23_2$ via the external connection terminal $21_3$ and further to the inverting input (−) of the receiver $23_1$ via the interconnection $14_2$ and the external connection terminal $21_2$. Furthermore, the connection terminals $13_4$ and $13_5$ are connected each other via the interconnection $14_3$, and therefore the transmission line 53 is connected to the non-inverting input (+) of the receiver $23_3$ via the external connection terminal $21_5$ and further to the inverting input (−) of the receiver $23_2$ via the interconnection $14_3$ and the external connection terminal $21_4$. Such connections allow converting the three-valued signals transmitted over the transmission lines 51, 52 and 53 into the two-valued single-ended signals with the receivers $23_1$ to $23_3$. In the meantime, each of the transmission lines 51, 52 and 53 is connected only to the single corresponding connection terminal 12 ($12_1$, $12_3$, $12_5$), and this effectively avoids an intersection of interconnections on the flexible circuit board 3A.

It should be noted that, although FIGS. 12A to 12C illustrates the configuration in which the transmission line 51 of the flexible circuit board 3A is connected to the external connection terminal $21_1$ of the driver IC 2 via the connection terminal $12_1$, the interconnection $11_1$ and the connection terminal $13_1$, which are formed on the liquid crystal display panel 1, the transmission line 51 may be connected to the external connection terminal $21_6$ in place of the external connection terminal $21_1$. In this case, the locations at which the interconnection $11_1$ and the connection terminal $12_1$ are accordingly modified and the interconnection $11_1$ and the connection terminal $12_1$ are connected to the connection terminal $13_6$ in place of the connection terminal $13_1$. Also in this case, the display module 10 can operate similarly, since the transmission line 51 is electrically connected to the external connection terminal $21_1$ via the interconnection $14_1$.

Similarly, the transmission line 52 may be connected to the external connection terminal $21_2$ in place of the external connection terminal $21_3$. In this case, the locations at which the interconnection $11_3$ and the connection terminal $12_3$ are placed are accordingly modified and the interconnection $11_3$ and the connection terminal $12_3$ are connected to the connection terminal $13_2$ in place of the connection terminal $13_3$. Also, the transmission line 53 may be connected to the external connection terminal $21_4$ in place of the external connection terminal $21_5$. In this case, the locations at which the interconnection $11_5$ and the connection terminal $12_5$ are placed are accordingly modified and the interconnection $11_5$ and the connection terminal $12_5$ are connected to the connection terminal $13_4$ in place of the connection terminal $13_5$.

FIGS. 13A to 13D are conceptual diagrams illustrating another exemplary configuration of a display module 10 designed to avoid an intersection of interconnections on the flexible circuit board 3A. In the configuration illustrated in FIGS. 13A to 13D, the flexible circuit board 3A is specially designed to avoid an intersection of interconnections on the flexible circuit board 3A. In the following, a description is given of the configuration of the display module 10 illustrated in FIGS. 13A to 13D.

Figure 13A:
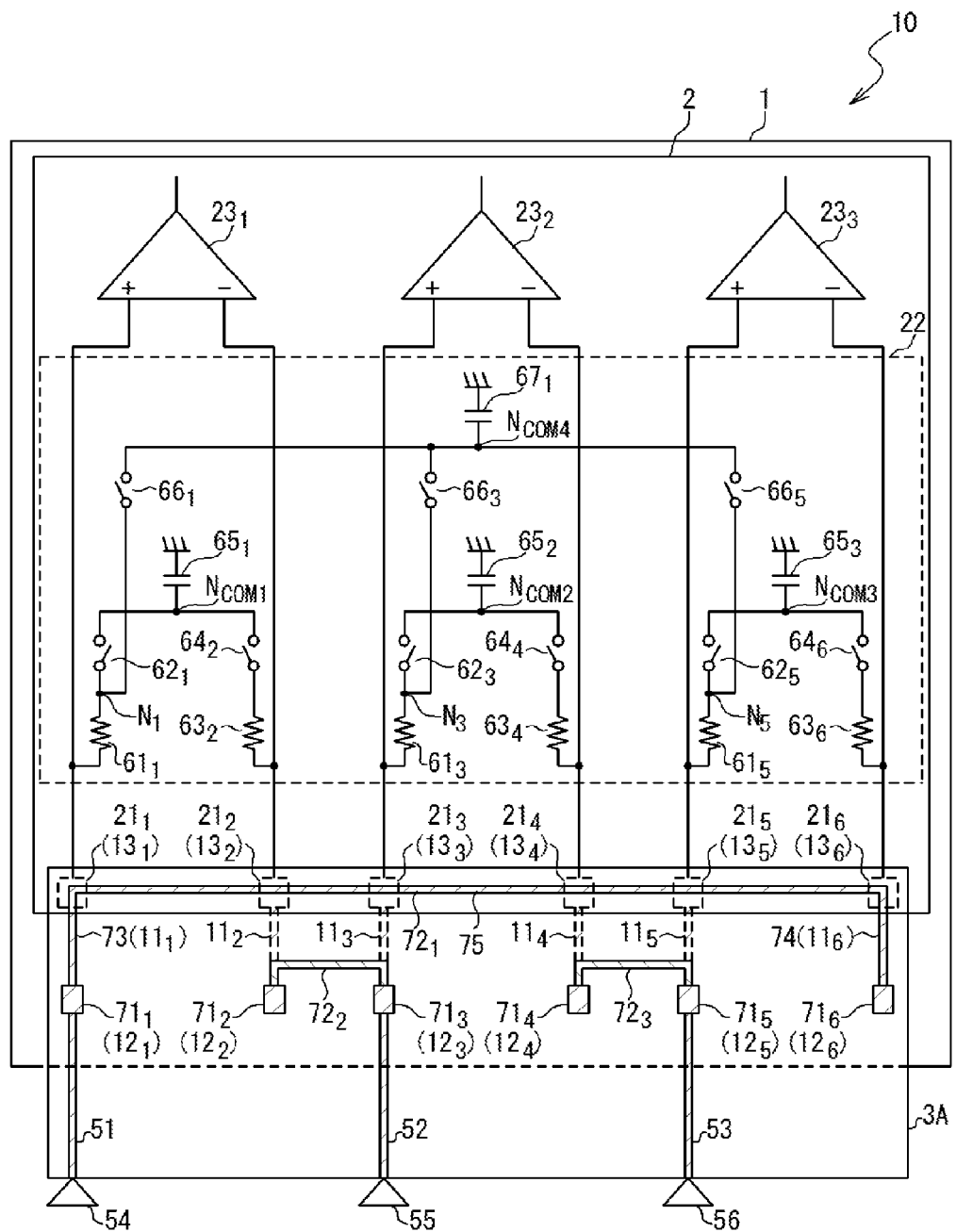
FIG. 13A is a conceptual diagram illustrating another exemplary configuration of a display module designed to avoid an intersection of interconnections on a flexible circuit board.
Figure 13B:
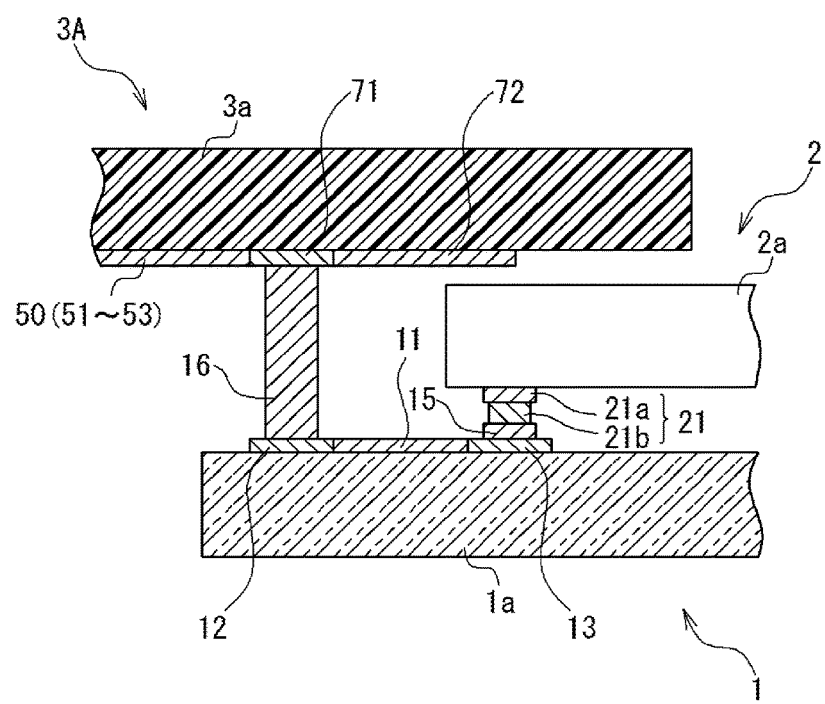
FIG. 13B is a section view conceptually illustrating one example of connection structures between a liquid crystal display panel and a driver IC and between the liquid crystal display panel and the flexible circuit board.

FIG. 13B is a section view conceptually illustrating one example of the connection structures between the liquid crystal display panel 1 and the driver IC 2 and between the liquid crystal display panel 1 and the flexible circuit board 3A, with respect to the display module 10 illustrated in FIGS. 13A to 13D. Formed on the glass substrate 1a of the liquid crystal display panel 1 are interconnections 11 and connection terminals 12 and 13. The external connection terminals 21 are formed on the semiconductor chip 2a of the driver IC 2. In the structure illustrated in FIG. 13B, each external connection terminal 21 includes a pad 21a and a bump 21b. Interconnections 50 (including the transmission lines 51 to 53), connection terminals 71 and interconnections 72 are formed on the resin substrate 3a of the flexible circuit board 3A.

Each of the bumps 21b of the external connection terminals 21 of the driver IC 2 is bonded to the corresponding connection terminal 13 of the liquid crystal display panel 1 via a contact 15. An anisotropic conductive film (ACF) may be used as the contact 15, for example. Similarly, each of the connection terminals 71 of the flexible circuit board 3A is bonded to the corresponding connection terminal 12 of the liquid crystal display panel 1 via a contact 16. An anisotropic conductive film may be used as the contact 16, for example.

Figure 13C:
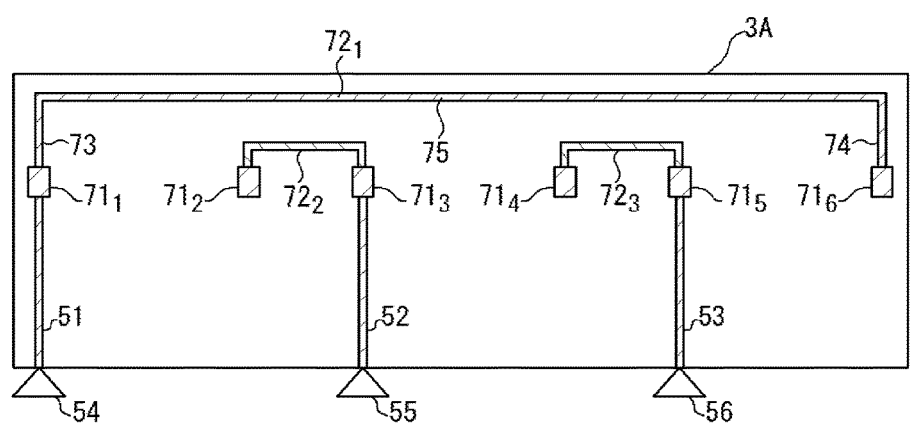
FIG. 13C is a plan view illustrating an exemplary routing of interconnections formed on the flexible circuit board.

FIG. 13C is a plan view illustrating the routing of the interconnections formed on the flexible circuit board 3A used for communications in accordance with the MIPI C-PHY specification. Formed on the flexible circuit board 3A are transmission lines 51, 52, 53, connection terminals $71_1$ to $71_6$, and interconnections $72_1$ to $72_3$. The connection terminals $71_1$ to $71_6$ are connected to the connection terminals $12_1$ to $12_6$ of the liquid crystal display panel 1. The connection terminals $71_1$, $71_3$ and $71_5$, which are three of the six connection terminals 71, are connected to the transmission lines 51, 52 and 53, respectively. The connection terminals $71_1$ and $71_6$ are connected to each other via the interconnection $72_1$. Similarly, the connection terminals $71_2$ and $71_3$ are connected to each other via the interconnection $72_2$, and the connection terminals $71_4$ and $71_5$ are connected to each other via the interconnection $72_3$.

It should be noted that, in the structure illustrated in FIG. 13C, the interconnection $72_1$, which connects the connection terminals $71_1$ and $71_6$ (those positioned at the both ends of the array of the connection terminals $71_1$ to $71_6$), is positioned opposite to the region in which the transmission lines 51, 52 and 53 are placed, across the array of the connection terminals $71_1$ to $71_6$. More specifically, the interconnection $72_1$ includes an interconnection segment 73 extended from the connection terminal $71_1$ in the direction opposite to the region in which the transmission lines 51, 52 and 53 are placed, an interconnection segment 74 extended from the connection terminal $71_6$ in the direction opposite to the region in which the transmission lines 51, 52 and 53 are placed, and an interconnection segment 75 which connects the interconnection segments 73 and 74. This routing of the interconnection $72_1$ effectively avoids the interconnection $72_1$ intersecting with the transmission lines 51, 52 and 53.

Although the interconnection $72_2$, which connects the connection terminals $71_2$ and $71_3$, and the interconnection $72_3$, which connects the connection terminals $71_4$ and $71_5$, are also positioned opposite to the region in which the transmission lines 51, 52 and 53 are placed, across the array of the connection terminals $71_1$ to $71_6$ in the structure illustrated in FIG. 13C, the interconnections $72_2$ and $72_3$ may be arbitrarily routed as long as the interconnections $72_2$ and $72_3$ do not intersect with the transmission lines 51, 52 and 53. For example, the interconnection $72_2$ may be routed along the shortest line connecting the connection terminals $71_2$ and $71_3$, since the connection terminals $71_2$ and $71_3$ are placed adjacent to each other. Similarly, the interconnection $72_3$ may be routed along the shortest line connecting the connection terminals $71_4$ and $71_5$.

Figure 13D:
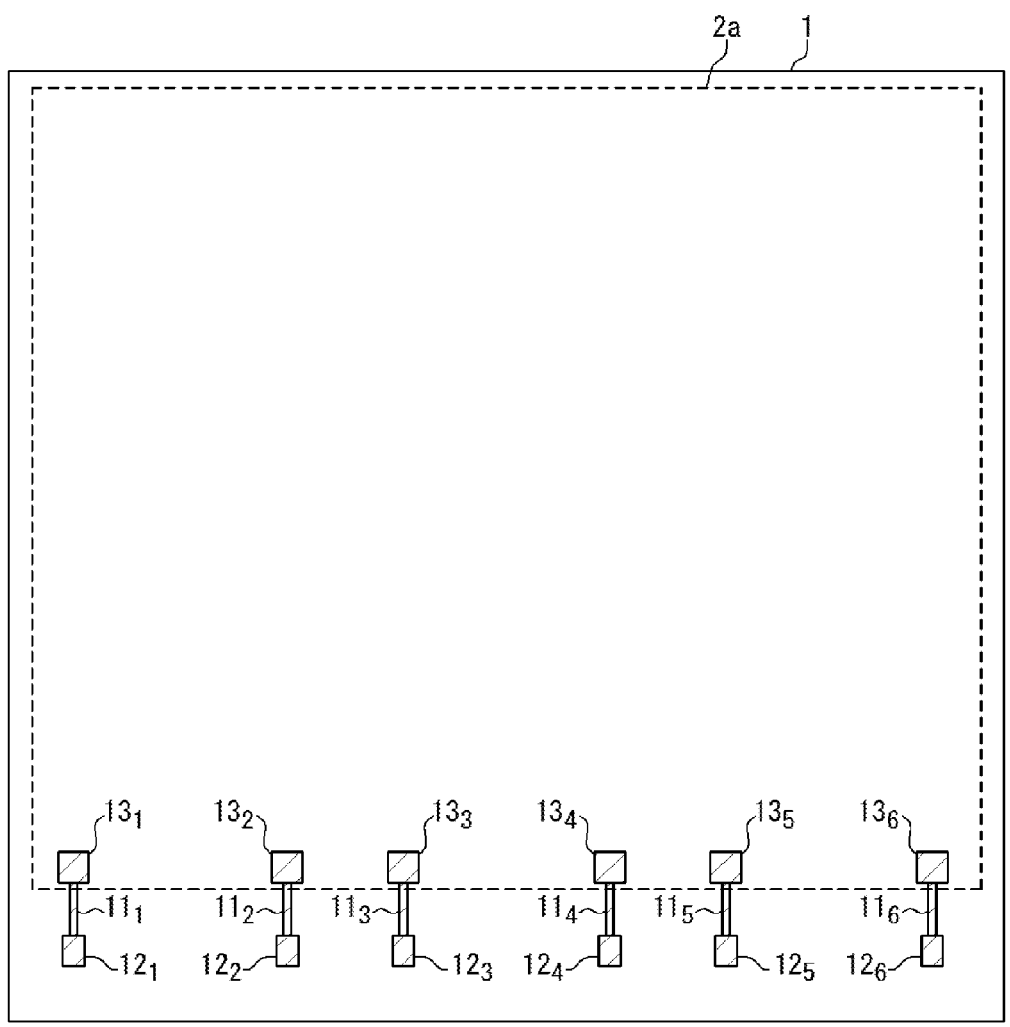
FIG. 13D is a plan view illustrating an exemplary routing of interconnections formed on the liquid crystal display panel.

As illustrated in FIG. 13D, formed on the liquid crystal display panel 1 are the interconnections $11_1$ to $11_6$, the connection terminals $12_1$ to $12_6$, and the connection terminals $13_1$ to $13_6$. As described above, the connection terminals $12_1$ to $12_6$ are connected to the connection terminals $71_1$ to $71_6$ of the flexible circuit board 3A, and the connection terminals $12_1$ to $12_6$ are connected to the external connection terminals $21_1$ to $21_6$ of the driver IC 2.

The display module 10 thus structured also allows electrically connecting the transmission lines 51, 52 and 53 to the receivers $23_1$, $23_2$ and $23_3$ of the driver IC 2 when performing communications in accordance with the MIPI C-PHY specification, while avoiding an intersection of interconnections on the flexible circuit board 3A. More specifically, as illustrated in FIG. 13A, the transmission lines 51, 52 and 53 are connected to the connection terminals $71_1$, $71_3$ and $71_5$ on the flexible circuit board 3A, respectively, and the connection terminals $71_1$, $71_3$ and $71_5$ are further connected to the connection terminals $71_6$, $71_2$ and $71_4$ via the interconnections $72_1$, $72_2$ and $72_3$, respectively. Furthermore, the connection terminals $71_1$ to $71_6$ are connected to the connection terminals $12_1$ to $12_6$ of the liquid crystal display panel 1, respectively, and the external connection terminals $21_1$ to $21_6$ of the driver IC 2 are connected to the connection terminals $13_1$ to $13_6$ of the liquid crystal display panel 1.

In such connections, the transmission line 51 is connected to the non-inverting input (+) of the receiver $23_1$ via the connection terminal $71_1$, the connection terminal $12_1$, the interconnection $11_1$ and the external connection terminal $21_1$ and further to the inverting input (−) of the receiver $23_3$ via the interconnection $72_1$, the connection terminal $71_6$ the connection terminal $12_6$, the interconnection $11_6$ and the external connection terminal $21_6$. Similarly, the transmission line 52 is connected to the non-inverting input (+) of the receiver $23_2$ via the connection terminal $71_3$, the connection terminal $12_3$, the interconnection $11_3$ and the external connection terminal $21_3$ and further to the inverting input (−) of the receiver $23_1$ via the interconnection $72_2$, the connection terminal $71_2$ the connection terminal $12_2$, the interconnection $11_2$ and the external connection terminal $21_2$. Finally, the transmission line 53 is connected to the non-inverting input (+) of the receiver $23_3$ via the connection terminal $71_5$, the connection terminal $12_5$, the interconnection $11_5$ and the external connection terminal $21_5$ and further to the inverting input (−) of the receiver $23_2$ via the interconnection $72_3$, the connection terminal $71_4$ the connection terminal $12_4$, the interconnection $11_4$ and the external connection terminal $21_4$. Such connections allow converting the three-valued signals transmitted over the transmission lines 51, 52 and 53 into the two-valued single-ended signals with the receivers $23_1$ to $23_3$. In the meantime, each of the transmission lines 51, 52 and 53 is connected only to the single corresponding connection terminals ($71_1$, $71_3$, $71_5$), and this effectively avoids an intersection of interconnections on the flexible circuit board 3A.

It should be noted that, although FIGS. 13A to 13D illustrate that the transmission line 51 is connected to the connection terminal $71_1$ on the flexible circuit board 3A, the transmission line 51 may be connected to the connection terminal $71_6$ in place of the connection terminal $71_1$. Also in this case, the display module 10 can operate similarly, since the transmission line 51 is electrically connected to the connection terminal $71_1$ via the interconnection $72_1$. Similarly, the transmission line 52 may be connected to the connection terminal $71_2$ in place of the connection terminal $71_3$. Also in this case, the transmission line 52 is connected to the connection terminal $71_3$ via the interconnection $72_2$. Furthermore, the transmission line 53 may be connected to the connection terminal $71_4$ in place of the connection terminal $71_5$. Also in this case, the transmission line 53 is connected to the connection terminal $71_5$ via the interconnection $72_3$.

Switching Between MIPI C-PHY and MIPI D-PHY within Driver IC

In the above-described embodiments, interconnections disposed on the flexible circuit board 3 and/or the liquid crystal display panel 1 are to be designed depending on which of the MIPI C-PHY and MIPI D-PHY specifications is used for communications; however, it may be undesirable for a user that interconnections of the liquid crystal display panel 1 and the flexible circuit board are to be specially designed.

To address this problem, in embodiments described the following, the driver IC 2 is configured to switch the communication scheme between the MIPI C-PHY specification and the MIPI D-PHY specification within the driver IC 2, with simple design of interconnections on the liquid crystal display panel 1 and the flexible circuit board 3.

Figure 14:
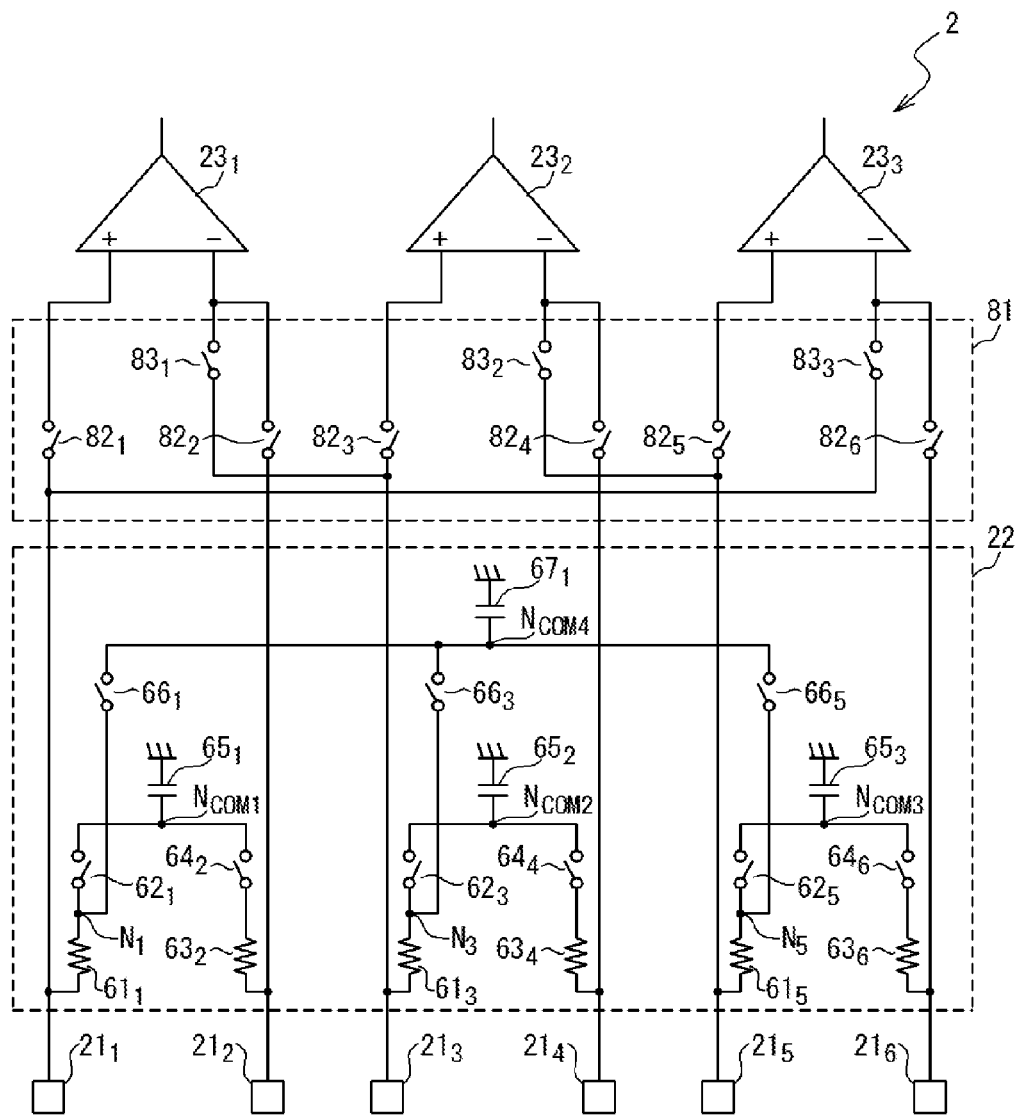
FIG. 14 is a circuit diagram illustrating an exemplary configuration of a driver IC configured to switch the communication scheme between the MIPI C-PHY specification and the MIPI D-PHY specification within the driver IC.

FIG. 14 is a circuit diagram illustrating an exemplary configuration of a driver IC 2 which is configured to switch the communication scheme between the MIPI C-PHY specification and the MIPI D-PHY specification within the driver IC 2 itself. In the present embodiment, as illustrated in FIG. 14, the driver IC 2 additionally includes a switch circuit 81 including input-side switches which switch the connections between the external connection terminals $21_1$ to $21_6$ and the inputs of the receivers $23_1$ to $23_3$.

The switch circuit 81 includes switches $82_1$ to $82_6$ and $83_1$ to $83_3$. The switch $82_1$ is connected between the non-inverting input (+) of the receiver $23_1$ and the external connection terminal $21_1$, and the switch $82_2$ is connected between the inverting input (−) of the receiver $23_1$ and the external connection terminal $21_2$. The switch $82_3$ is connected between the non-inverting input of the receiver $23_2$ and the external connection terminal $21_3$, and the switch $82_4$ is connected between the inverting input of the receiver $23_2$ and the external connection terminal $21_4$. The switch $82_5$ is connected between the non-inverting input of the receiver $23_3$ and the external connection terminal $21_5$, and the switch $82_6$ is connected between the inverting input of the receiver $23_3$ and the external connection terminal $21_6$.

The switches $83_1$ to $83_3$ are used to connect the external connection terminals $21_1$, $21_3$ and $21_5$, which are connected to the non-inverting inputs of the receivers $23_1$, $23_2$ and $23_3$, further to the inverting inputs of the receivers $23_3$, $23_1$ and $23_2$. The switch $83_1$ is connected between the inverting input of the receiver $23_1$ and the external connection terminal $21_3$, the switch $83_2$ is connected between the inverting input of the receiver $23_2$ and the external connection terminal $21_5$, and the switch $83_3$ is connected between the inverting input of the receiver $23_3$ and the external connection terminal $21_1$.

It should be noted that although FIG. 14 illustrates the configuration of the driver IC 2 including the terminal resistor circuit 22 illustrated in FIG. 8, a differently-configured terminal resistor circuit 22 (e.g., the terminal resistor circuit 22 illustrated in FIG. 10) may be used instead.

Figure 15A:
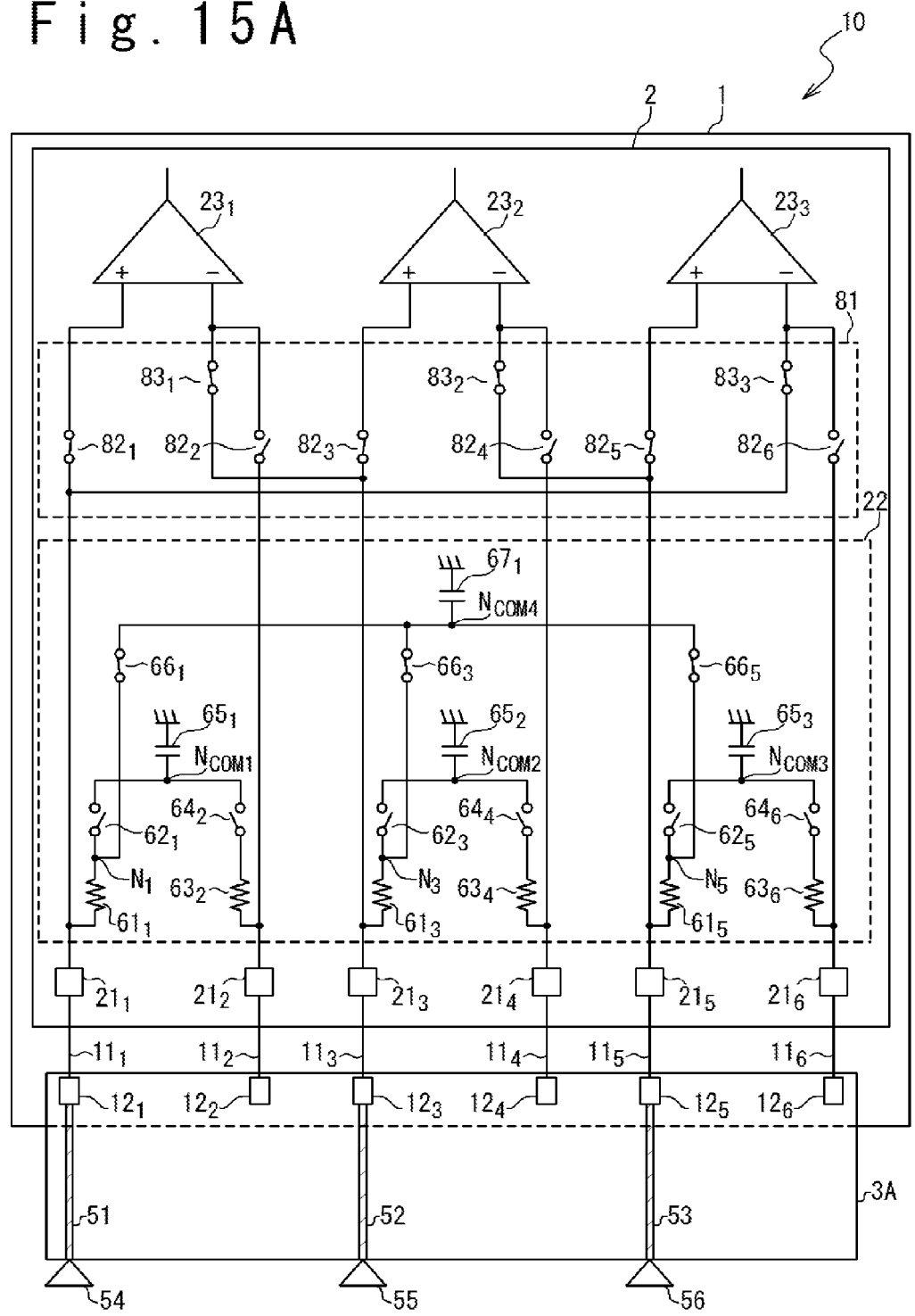
FIG. 15A illustrates the setting of the driver IC illustrated in FIG. 14 in the case when the driver IC performs communications in accordance with the MIPI C-PHY specification.

FIG. 15A illustrates the setting of the driver IC 2 illustrated in FIG. 14 in the case when the driver IC 2 performs communications in accordance with the MIPI C-PHY specification. In the present embodiment, when the communications are performed in accordance with the MIPI C-PHY specification, the transmission line 51 disposed on the flexible circuit board 3A is connected to the external connection terminal $21_1$, the transmission line 52 is connected to the external connection terminal $21_3$, and the transmission line 53 is connected to the external connection terminal $21_5$.

To achieve communications in accordance with the MIPI C-PHY specification, the switches $82_1$, $82_3$, $82_5$, $83_1$, $83_2$ and $83_3$ are turned on and the switches $82_2$, $82_4$ and $82_6$ are turned off. According to this setting, the transmission line 51 is connected to the non-inverting input of the receiver $23_1$ and the inverting input of the receiver $23_3$, the transmission line 52 is connected to the non-inverting input of the receiver $23_2$ and the inverting input of the receiver $23_1$, and the transmission line 53 is connected to the non-inverting input of the receiver $23_3$ and the inverting input of the receiver $23_2$. Accordingly, the three-valued signals transmitted over the transmission lines 51, 52 and 53 are successfully converted into single-ended signals by the receivers $23_1$ to $23_3$. As described above, the signals output from the receivers $23_1$ to $23_3$ are supplied to the C-PHY block 24 and the C-PHY block 24 performs signal processing on the signals output from the receivers $23_1$ to $23_3$ in accordance with the MIPI C-PHY specification, to generate the reception data $D_{C-PHY}$.

It should be noted that, in the terminal resistor circuit 22, the switches $66_1$, $66_3$ and $66_5$ are turned on and the switches $62_1$, $62_3$, $62_5$, $64_2$, $64_4$ and $64_6$ are turned off, when the communications are performed in accordance with the MIPI C-PHY specification. As described above, this setting allows the resistor elements $61_1$, $61_3$ and $61_5$ to be connected with a Y-connection, as recommended in the MIPI C-PHY specification.

Figure 15B:
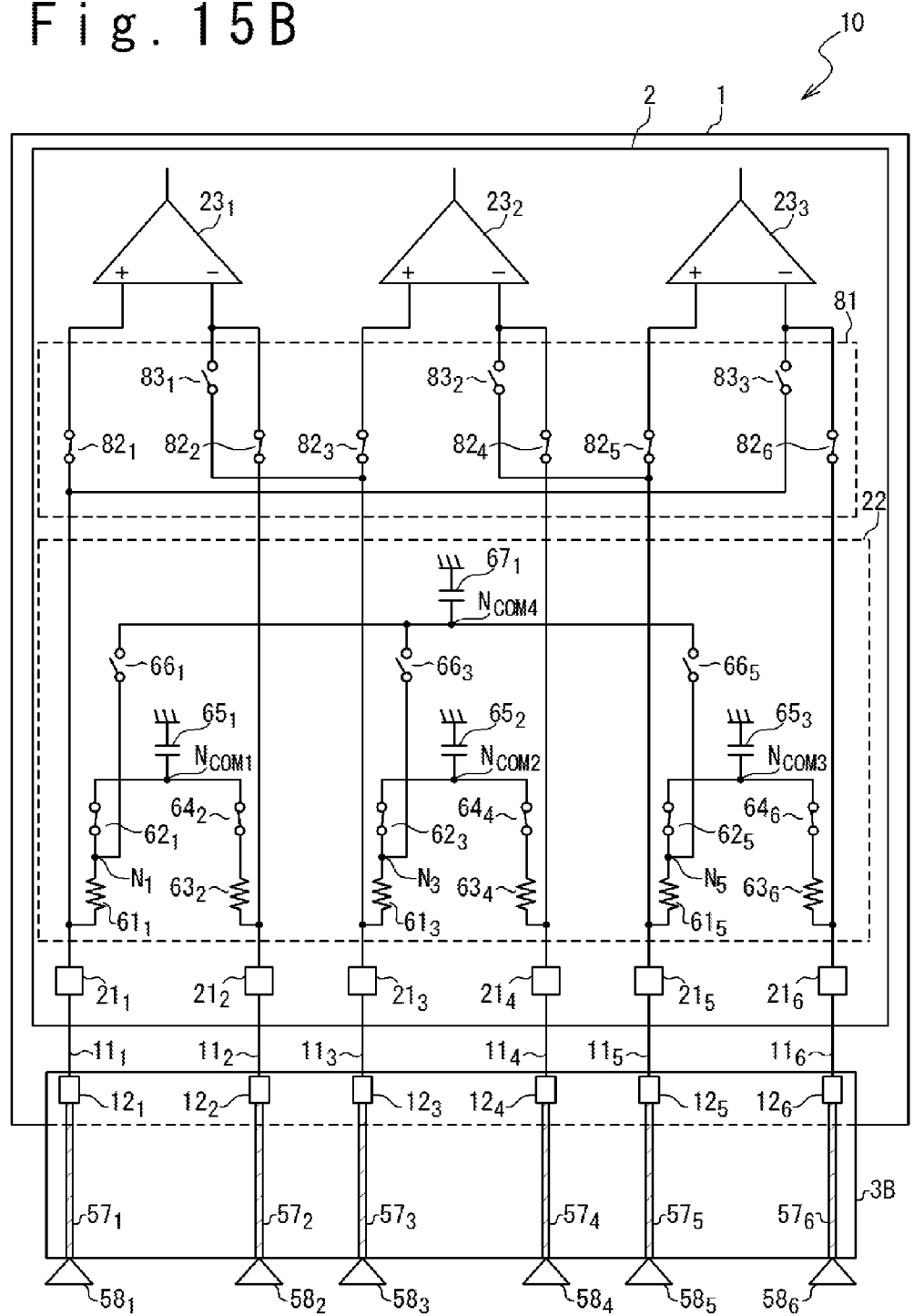
FIG. 15B illustrates the setting of the driver IC illustrated in FIG. 14 in the case when the driver IC performs communications in accordance with the MIPI D-PHY specification.

FIG. 15B illustrates the setting of the driver IC 2 of FIG. 14 in the case when the driver IC 2 performs the communications in accordance with the MIPI D-PHY specification. When the communications are performed in accordance with the MIPI D-PHY specification, the transmission lines $57_1$ to $57_6$ disposed on the flexible circuit board 3B are connected to the external connection terminals $21_1$ to $21_6$, respectively.

To achieve communications in accordance with the MIPI D-PHY specification, the switches $82_1$ to $82_6$ are turned on and the switches $83_1$ to $83_3$ are turned off. According to this setting, the transmission lines $57_1$ and $57_2$ are connected to the non-inverting and inverting inputs of the receiver $23_1$, respectively, the transmission lines $57_3$ and $57_4$ are connected to the non-inverting and inverting inputs of the receiver $23_2$, respectively, and the transmission lines $57_5$ and $57_6$ are connected to the non-inverting and inverting inputs of the receiver $23_3$, respectively. Accordingly, the differential signal transmitted over the transmission line $57_1$ and $57_2$, the differential signal transmitted over the transmission line $57_3$ and $57_4$ and the differential signal transmitted over the transmission line $57_5$ and $57_6$ are successfully converted into single-ended signals by the receivers $23_1$, $23_2$ and $23_3$, respectively. As described above, the signals output from the receivers $23_1$ to $23_3$ are supplied to the D-PHY block 25 and the D-PHY block 25 performs signal processing on the signals output from the receivers $23_1$ to $23_3$ in accordance with the MIPI D-PHY specification, to generate the reception data $D_{D\text{-}PHY}$.

It should be noted that, in the terminal resistor circuit 22, the switches $62_1$, $62_3$, $62_5$, $64_2$, $64_4$ and $64_6$ are turned on and the switches $66_1$, $66_3$ and $66_5$ are turned off, when the communications are performed in accordance with the MIPI D-PHY specification. As described above, this setting allows connecting the transmission lines $57_1$ and $57_2$ via the resistor elements $61_1$ and $63_2$, connecting the transmission lines $57_3$ and $57_4$ via the resistor elements $61_3$ and $63_4$ and connecting the transmission lines $57_5$ and $57_6$ via the resistor elements $61_5$ and $63_6$. Such connections are in accordance with the recommendation by the MIPI D-PHY specification.

As thus described, the configuration of the driver IC 2 illustrated in FIG. 14 allows switching the communication scheme between the MIPI C-PHY specification and the MIPI D-PHY specification within the driver IC 2.

Figure 16:
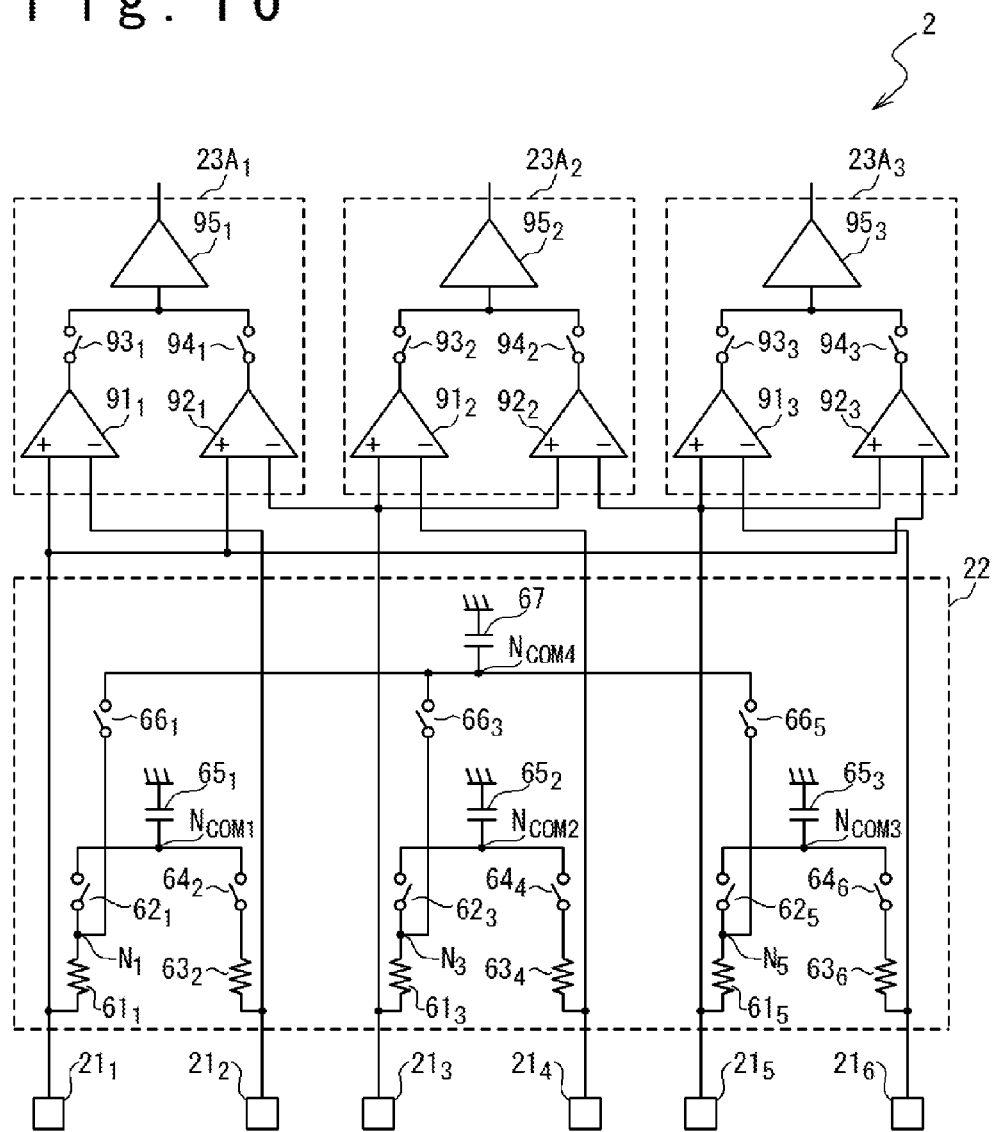
FIG. 16 is a circuit diagram illustrating another exemplary configuration of a driver IC configured to switch the communication scheme between the MIPI C-PHY specification and the MIPI D-PHY specification within the driver IC.

Instead of providing the switch circuit 81 between the external connection terminals $21_1$ to $21_6$ and the inputs of the receivers $23_1$, $23_2$ and $23_3$, the driver IC 2 may be configured so that each of the receivers includes a first input stage adapted to the communications in accordance with the MIPI C-PHY specification and a second input stage adapted to the communications in accordance with the MIPI D-PHY specification, and the first and second input stages are selected in each receiver. FIG. 16 is a circuit diagram illustrating an exemplary configuration of a driver IC 2 thus configured.

The driver IC 2 illustrated in FIG. 16 includes receivers $23A_1$, $23A_2$ and $23A_3$. The receiver $23A_1$ includes input stages $91_1$, $92_1$, output select switches $93_1$, $93_2$ and an output stage $95_1$. The input stage $91_1$ is a differential input circuit used for the communications in accordance with the MIPI D-PHY specification, having a non-inverting input (+) connected to the external connection terminal $21_1$ and an inverting input (−) connected to the external connection terminal $21_2$. The input stage $92_1$ is a differential input circuit used for the communications in accordance with the MIPI C-PHY specification, having a non-inverting input connected to the external connection terminal $21_1$ and an inverting input connected to the external connection terminal $21_3$. The output select switch $93_1$ is connected between the output of the input stage $91_1$ and an input of the output stage $95_1$ and the output select switch $94_1$ is connected between the output of the input stage $92_1$ and another input of the output stage $95_1$. The output stage $95_1$ outputs a single-ended signal in response to the output signal received from one of the input stages $91_1$ and $92_1$, selected by the output select switches $93_1$ and $94_1$. A differential amplifier circuit with a commonly-used simple circuit configuration may be used as the input stage $91_1$ and $92_1$.

The receivers $23A_2$ and $23A_3$ are configured similarly. The receiver $23A_2$ includes input stages $91_2$, $92_2$, output select switches $93_2$, $94_2$ and an output stage $95_2$. The input stage $91_2$ is a differential input circuit used for the communications in accordance with the MIPI D-PHY specification, having a non-inverting input connected to the external connection terminal $21_3$ and an inverting input connected to the external connection terminal $21_4$. The input stage $92_2$ is a differential input circuit used for the communications in accordance with the MIPI C-PHY specification, having a non-inverting input connected to the external connection terminal $21_3$ and an inverting input connected to the external connection terminal $21_5$. The output select switch $93_2$ is connected between the output of the input stage $91_2$ and an input of the output stage $95_2$ and the output select switch $94_2$ is connected between the output of the input stage $92_2$ and another input of the output stage $95_2$. The output stage $95_2$ outputs a single-ended signal in response to the output signal received from one of the input stages $91_2$ and $92_2$, selected by the output select switches $93_2$ and $94_2$. A differential amplifier circuit with a commonly-used simple circuit configuration may be used as the input stage $91_2$ and $92_2$.

Similarly, the receiver $23A_3$ includes input stages $91_3$, $92_3$, output select switches $93_3$, $94_3$ and an output stage $95_3$. The input stage $91_3$ is a differential input circuit used for the communications in accordance with the MIPI D-PHY specification, having a non-inverting input connected to the external connection terminal $21_5$ and an inverting input connected to the external connection terminal $21_6$. The input stage $92_3$ is a differential input circuit used for the communications in accordance with the MIPI C-PHY specification, having a non-inverting input connected to the external connection terminal $21_5$ and an inverting input connected to the external connection terminal $21_1$. The output select switch $93_3$ is connected between the output of the input stage $91_3$ and an input of the output stage $95_3$ and the output select switch $94_3$ is connected between the output of the input stage $92_3$ and another input of the output stage $95_3$. The output stage $95_3$ outputs a single-ended signal in response to the output signal received from one of the input stages $91_3$ and $92_3$, selected by the output select switches $93_3$ and $94_3$. A differential amplifier circuit with a commonly-used simple circuit configuration may be used as the input stage $91_3$ and $92_3$.

Figure 17A:
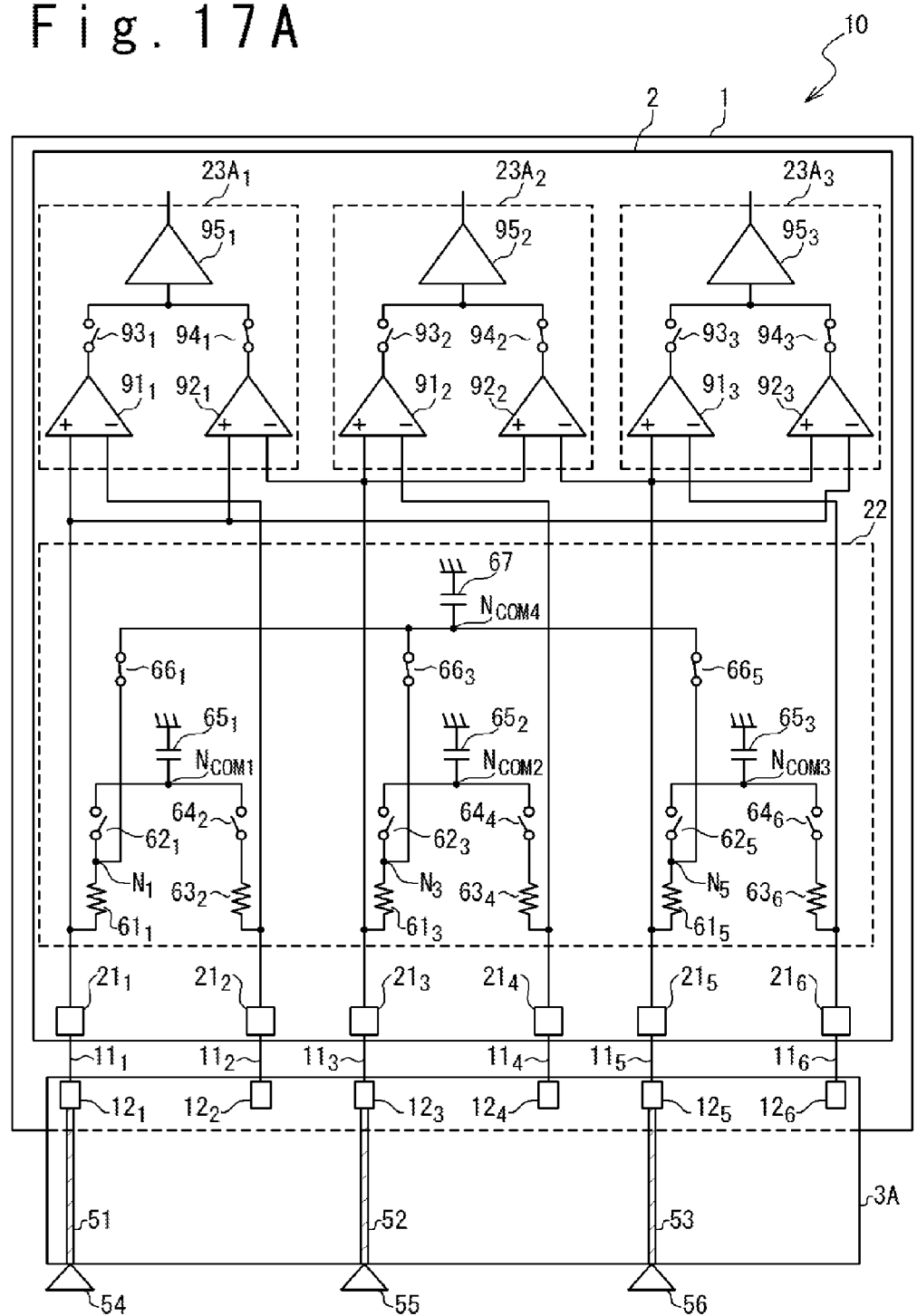
FIG. 17A illustrates the setting of the driver IC illustrated in FIG. 16 in the case when the driver IC performs communications in accordance with the MIPI C-PHY specification.

FIG. 17A illustrates an exemplary setting of the driver IC 2 illustrated in FIG. 16 in the case when the driver IC 2 performs the communications in accordance with the MIPI C-PHY specification. In the present embodiment, when the communication are performed in accordance with the MIPI C-PHY specification, the transmission lines 51, 52 and 53 disposed on the flexible circuit board 3A are connected to the external connection circuit $21_1$, $21_3$ and $21_5$, respectively.

To achieve communications in accordance with the MIPI C-PHY specification, the input stage $92_1$ is selected in the receiver $23A_1$ by turning off the output select switch $93_1$ and turning on the output select switch $94_1$. Similarly, the input stage $92_2$ is selected in the receiver $23A_2$ by turning off the output select switch $93_2$ and turning on the output select switch $94_2$, and the input stage $92_3$ is selected in the receiver $23A_3$ by turning off the output select switch $93_3$ and turning on the output select switch $94_3$. It should be noted here that the transmission line 51 is connected to the non-inverting input (+) of the input stage $92_1$ of the receiver $23A_1$ and the inverting input (−) of the input stage $92_3$ of the receiver $23A_3$, the transmission line 52 is connected to the non-inverting input (+) of the input stage $92_2$ of the receiver $23A_2$ and the inverting input (−) of the input stage $92_1$ of the receiver $23A_1$, and the transmission line 53 is connected to the non-inverting input (+) of the input stage $92_3$ of the receiver $23A_3$ and the inverting input (−) of the input stage $92_2$ of the receiver $23A_2$. Such connections allow converting the three-valued signals transmitted over the transmission lines 51, 52 and 53 into the single-ended signals by the receivers $23A_1$ to $23A_3$. As described above, the signals output from the receivers $23A_1$ to $23A_3$ are supplied to the C-PHY block 24 and the C-PHY block 24 performs signal processing on the signals received from the receivers $23A_1$ to $23A_3$ in accordance with the MIPI C-PHY specification, to generate the reception data $D_{C-PHY}$.

It should be noted that, in the terminal resistor circuit 22, the switches $66_1$, $66_3$ and $66_5$ are turned on and the switches $62_1$, $62_3$, $62_5$, $64_2$, $64_4$ and $64_6$ are turned off, when the communications are performed in accordance with the MIPI C-PHY specification. As described above, this setting allows the resistor elements $61_1$, $61_3$ and $61_5$ to be connected with a Y-connection, as recommended in the MIPI C-PHY specification.

Figure 17B:
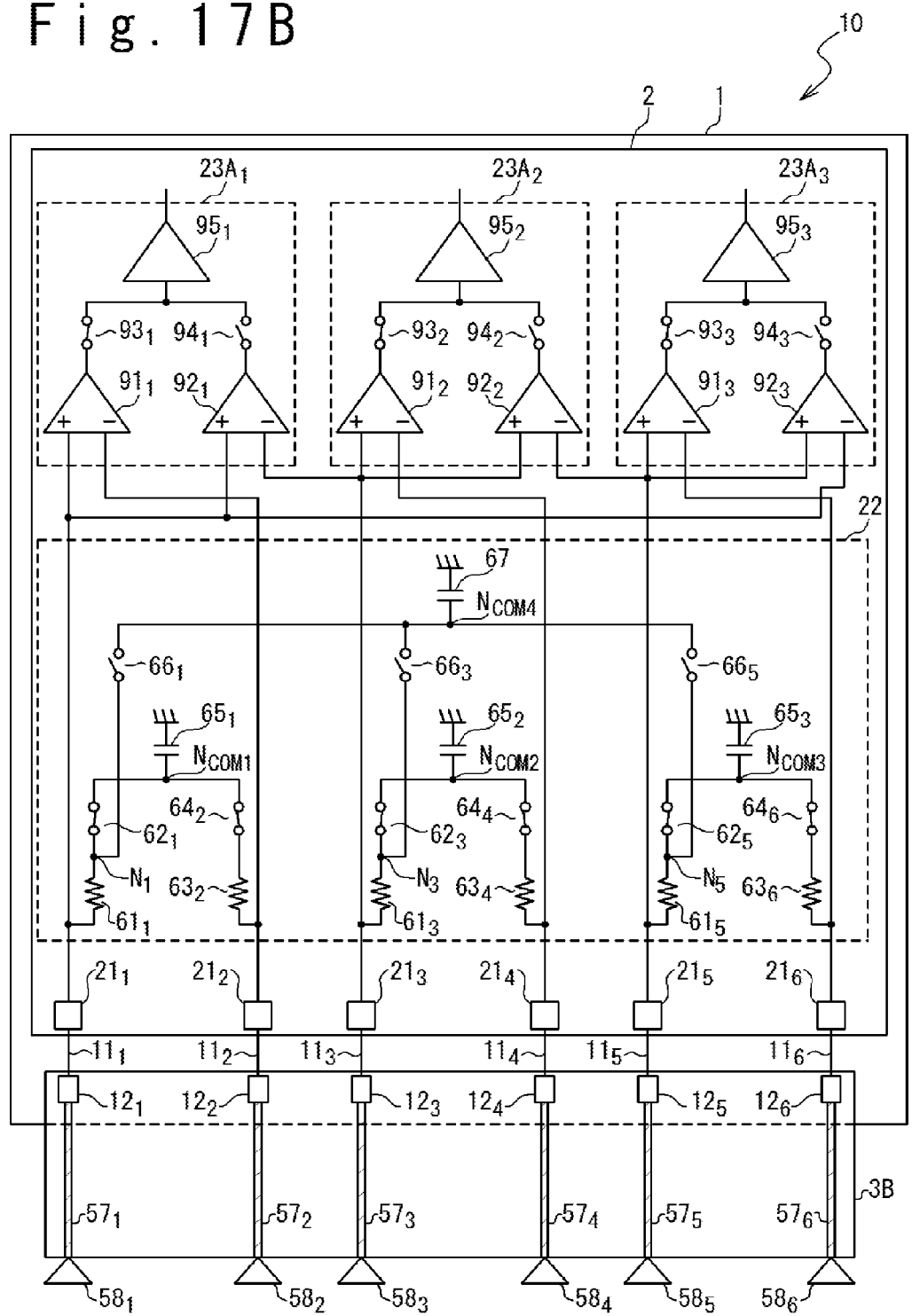
FIG. 17B illustrates the setting of the driver IC illustrated in FIG. 16 in the case when the driver IC performs communications in accordance with the MIPI D-PHY specification.

FIG. 17B illustrates an exemplary setting of the driver IC 2 in the case when the driver IC 2 performs the communications in accordance with the MIPI D-PHY specification. When the communications are performed in accordance with the MIPI D-PHY specification, as described above, the transmission lines $57_1$ to $57_6$ disposed on the flexible circuit board 3B are connected to the external connection terminals $21_1$ to $21_6$, respectively.

To achieve communications in accordance with the MIPI D-PHY specification, the input stage $91_1$ is selected in the receiver $23A_1$ by turning off the output select switch $94_1$ and turning on the output select switch $93_1$. Similarly, the input stage $91_2$ is selected in the receiver $23A_2$ by turning off the output select switch $94_2$ and turning on the output select switch $93_2$, and the input stage $91_3$ is selected in the receiver $23A_3$ by turning off the output select switch $94_3$ and turning on the output select switch $93_3$.

It should be noted here that the transmission lines $57_1$ and $57_2$ are connected to the non-inverting input (+) and inverting input (−) of the input stage $91_1$ of the receiver $23A_1$, respectively, the transmission lines $57_3$ and $57_4$ are connected to the non-inverting input (+) and inverting input (−) of the input stage $91_2$ of the receiver $23A_2$, respectively, and the transmission lines $57_5$ and $57_6$ are connected to the non-inverting input (+) and inverting input (−) of the input stage $91_3$ of the receiver $23A_3$, respectively. Such connections allows converting the differential signal transmitted over the transmission lines $57_1$ and $57_2$ into a single-ended signal with the receiver $23A_1$, converting the differential signal transmitted over the transmission lines $57_3$ and $57_4$ into a single-ended signal with the receiver $23A_2$, and converting the differential signal transmitted over the transmission lines $57_5$ and $57_6$ into a single-ended signal with the receiver $23A_3$. As described above, the signals output from the receivers $23A_1$ to $23A_3$ are supplied to the D-PHY block 25 and the D-PHY block 25 performs signal processing on the signals output from the receivers $23A_1$ to $23A_3$ to generate the reception data $D_{D-PHY}$.

It should be noted that, in the terminal resistor circuit 22, the switches $62_1$, $62_3$, $62_5$, $64_2$, $64_4$ and $64_6$ are turned on and the switches $66_1$, $66_3$ and $66_5$ are turned off, when the communications are performed in accordance with the MIPI D-PHY specification. As described above, this setting allows connecting the transmission lines $57_1$ and $57_2$ via the resistor elements $61_1$ and $63_2$, connecting the transmission lines $57_3$ and $57_4$ via the resistor elements $61_3$ and $63_4$, and connecting the transmission lines $57_5$ and $57_6$ via the resistor elements $61_5$ and $63_6$. Such connections are in accordance with the recommendation by the MIPI D-PHY specification.

Although FIG. 16 illustrates the configuration of the driver IC 2 which includes the terminal resistor circuit 22 illustrated in FIG. 8, a person skilled in the art would appreciate that the configuration of the terminal resistor circuit 22 may be variously modified. For example, the terminal resistor circuit 22 illustrated in FIG. 10 may be used instead.

Figure 18:
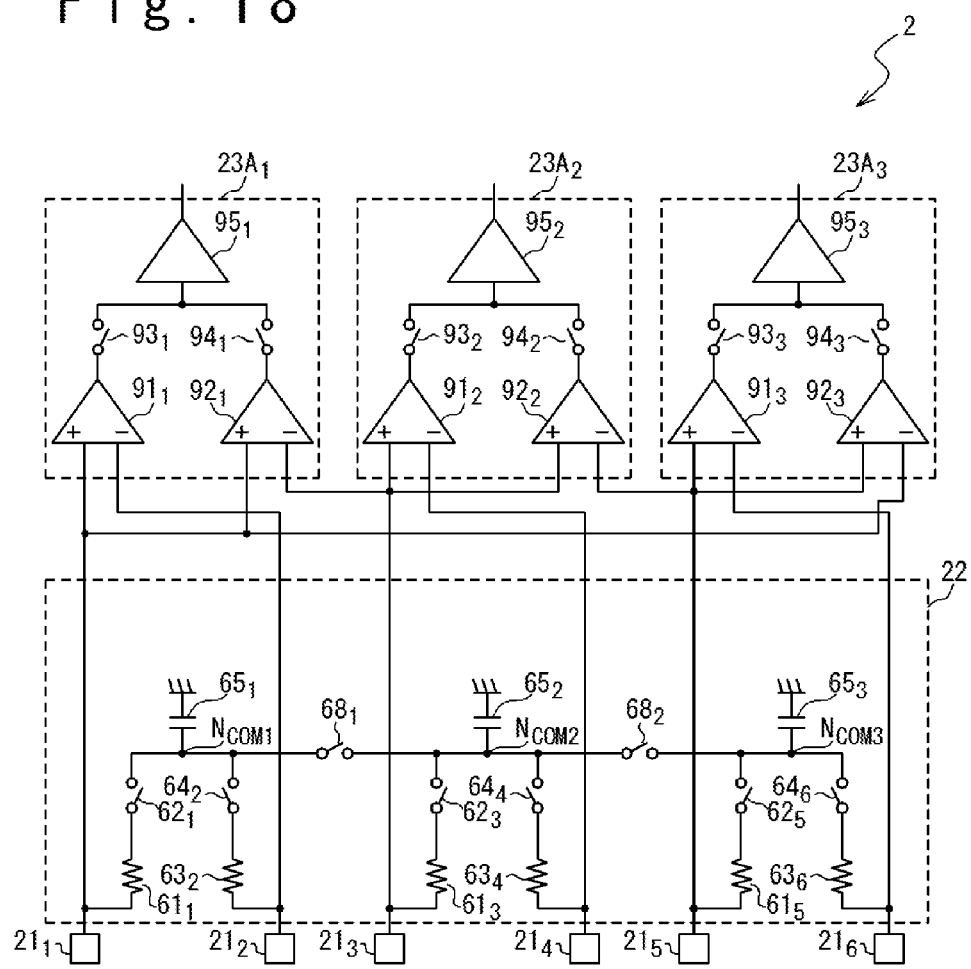
FIG. 18 is a circuit diagram illustrating still another exemplary configuration of a driver IC configured to switch the communication scheme between the MIPI C-PHY specification and the MIPI D-PHY specification within the driver IC.

When each receiver 23A separately includes an input stage 91 receiving the differential signal transmitted in the communications in accordance with the MIPI D-PHY specification and an input stage receiving the three-valued signal transmitted in the communications in accordance with the MIPI C-PHY specification as illustrated in FIG. 16, a terminal resistor circuit 22 may be used which includes only a reduced number of circuit elements. FIG. 18 is a circuit diagram illustrating an exemplary configuration of a driver IC 2 which incorporates a terminal resistor circuit 22 including a reduced number of circuit elements.

In the driver IC 2 illustrated in FIG. 18, the terminal resistor circuit 22 includes: resistor elements $61_1$, $61_3$, $61_5$, switches $62_1$, $62_3$, $62_5$, resistor elements $63_2$, $63_4$, $63_6$, switches $64_2$, $64_4$, $64_6$, capacitors $65_1$, $65_2$, $65_3$ and switches $68_1$ and $68_2$. In one preferred embodiment, the resistor elements $61_1$, $61_3$, $61_5$, $63_2$, $63_4$ and $63_6$ each have a resistance of 50Ω.

The capacitors $65_1$, $65_2$ and $65_3$ are connected between the circuit ground and the common connection nodes $N_{COM1}$, $N_{COM2}$ and $N_{COM3l}$, respectively. The common connection nodes $N_{COM1}$, $N_{COM2}$ and $N_{COM3l}$ are AC-grounded via the capacitors $65_1$, $65_2$ and $65_3$.

The resistor element $61_1$ and the switch $62_1$ are connected in series between the external connection terminal $21_1$ and the common connection node $N_{COM1}$ and the resistor element $63_2$ and the switch $64_2$ are connected in series between the external connection terminal $21_2$ and the common connection node $N_{COM1}$. The resistor element $61_3$ and the switch $62_3$ are connected in series between the external connection terminal $21_3$ and the common connection node $N_{COM2}$ and the resistor element $63_4$ and the switch $64_4$ are connected in series between the external connection terminal $21_4$ and the common connection node $N_{COM2}$. The resistor element $61_5$ and the switch $62_5$ are connected in series between the external connection terminal $21_5$ and the common connection node $N_{COM3}$ and the resistor element $63_6$ and the switch $64_6$ are connected in series between the external connection terminal $21_6$ and the common connection node $N_{COM3}$.

Furthermore, the switch $68_1$ is connected between the common connection nodes $N_{COM1}$ and $N_{COM2}$ and the switch $68_2$ is connected between the common connection nodes $N_{COM2}$ and $N_{COM3}$.

Figure 19A:
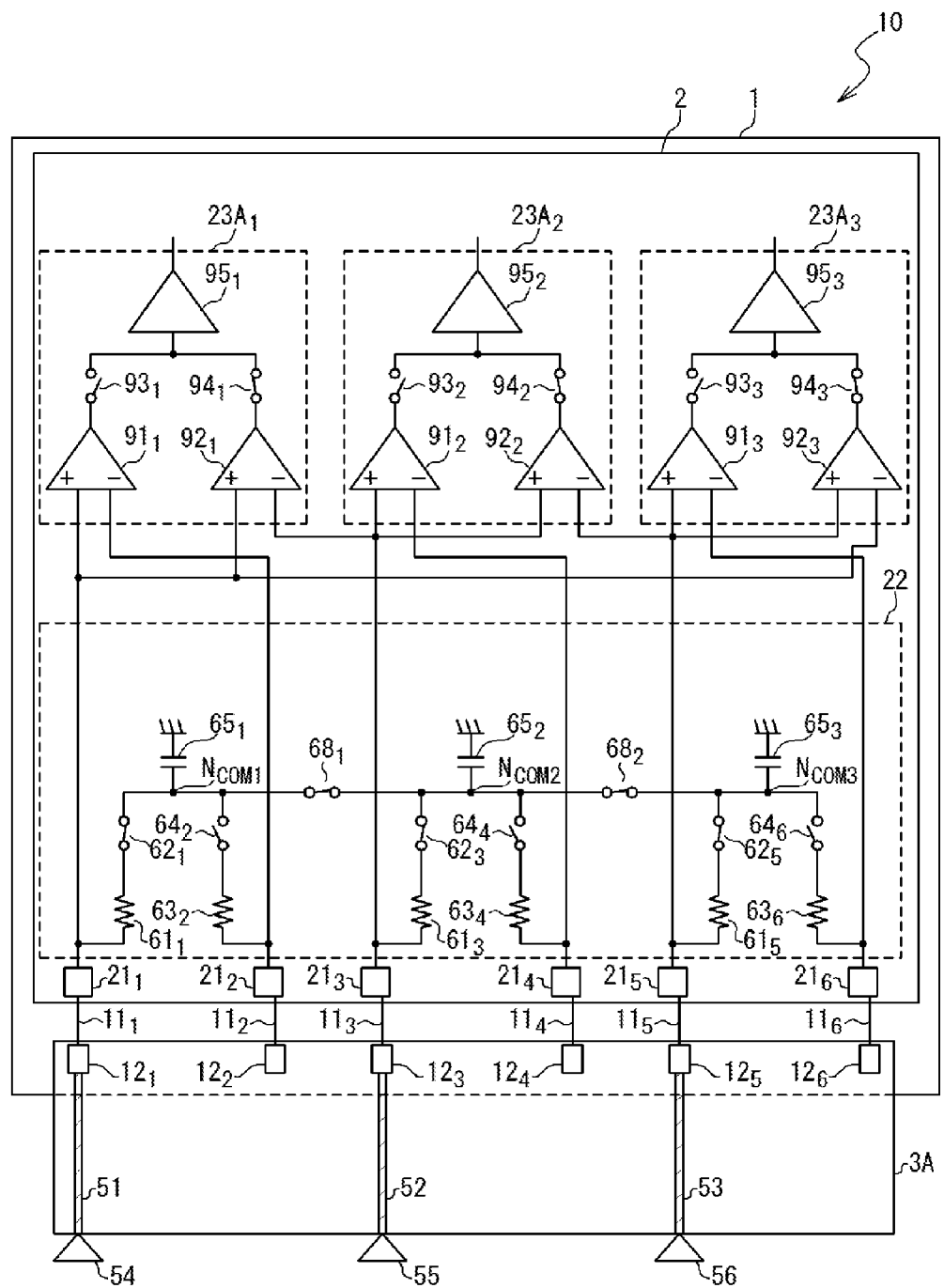
FIG. 19A illustrates an exemplary setting of the driver IC illustrated in FIG. 18 in the case when the driver IC performs communications in accordance with the MIPI C-PHY specification.

FIG. 19A illustrates an exemplary setting of the driver IC 2 illustrated in FIG. 18 in the case when the driver IC 2 performs communications in accordance with the MIPI C-PHY specification. When the driver IC 2 performs communications in accordance with the MIPI C-PHY specification, the transmission lines 51, 52 and 53 disposed on the flexible circuit board 3A are connected to the external connection terminals $21_1$, $21_3$ and $21_5$, respectively.

To achieve the communications in accordance with the MIPI C-PHY specification, as described above, the input stage $92_1$ is selected in the receiver $23A_1$ by turning on the output select switch $93_1$ and turning off the output select switch $94_1$. Similarly, the input stage $92_2$ is selected in the receiver $23A_2$ by turning on the output select switch $93_2$ and turning off the output select switch $94_2$, and the input stage $92_3$ is selected in the receiver $23A_3$ by turning on the output select switch $93_3$ and turning off the output select switch $94_3$. Such connections allow converting the three-valued signals transmitted over the transmission lines 51, 52 and 53 into single-ended signals by using the receivers $23A_1$ to $23A_3$.

In the meantime, in the terminal resistor circuit 22, the switches $62_1$, $62_3$, $62_5$, $68_1$ and $68_2$ are turned on and the switches $64_2$, $64_4$ and $64_6$ are turned off. The turn-on of the switches $68_1$ and $68_2$ results in that the common connection nodes $N_{COM1}$ to $N_{COM3}$ are electrically connected. Since the common connection nodes $N_{COM1}$ to $N_{COM3}$ can be considered as one node in the sense of the electrical state when the common connection nodes $N_{COM1}$ to $N_{COM3}$ are electrically connected to each other, the common connection nodes $N_{COM1}$ to $N_{COM3}$ may be referred to as the common connection node $N_{COM1-3}$, when they are electrically connected each other. Furthermore, the switches $62_1$, $62_3$ and $62_5$ are turned on and the resistor elements $61_1$, $61_3$ and $61_5$ are thereby commonly connected to the common connection node $N_{COM1-3}$. As a result, the transmission line 51 is connected to the common connection node $N_{COM1-3}$ via the resistor element $61_1$, the transmission line 52 is connected to the common connection node $N_{COM1-3}$ via the resistor element $61_2$, and the transmission line 53 is connected to the common connection node $N_{COM1-3}$ via the resistor element $61_3$. In other words, the resistor elements $61_1$, $61_3$ and $61_5$ are connected to the transmission lines 51, 52 and 53, respectively, with a Y-connection, as recommended in the MIPI C-PHY specification. It would be preferable that the resistor elements $61_1$, $61_3$ and $61_5$ each have a resistance of $50\Omega$, since this offers a Y-connection of terminal resistors of $50\Omega$, as recommended by the MIPI C-PHY specification.

In the setting of the terminal resistor circuit 22 illustrated in FIG. 19A, the external connection terminals $21_2$, $21_4$, $21_6$ and nodes electrically connected thereto are electrically set to floating. This may undesirably cause noise in the signals supplied to the input stages $92_1$, $92_2$ and $92_3$ of the receivers $23A_1$, $23A_2$ and $23A_3$, due to a signal cross-talk.

Figure 19B:
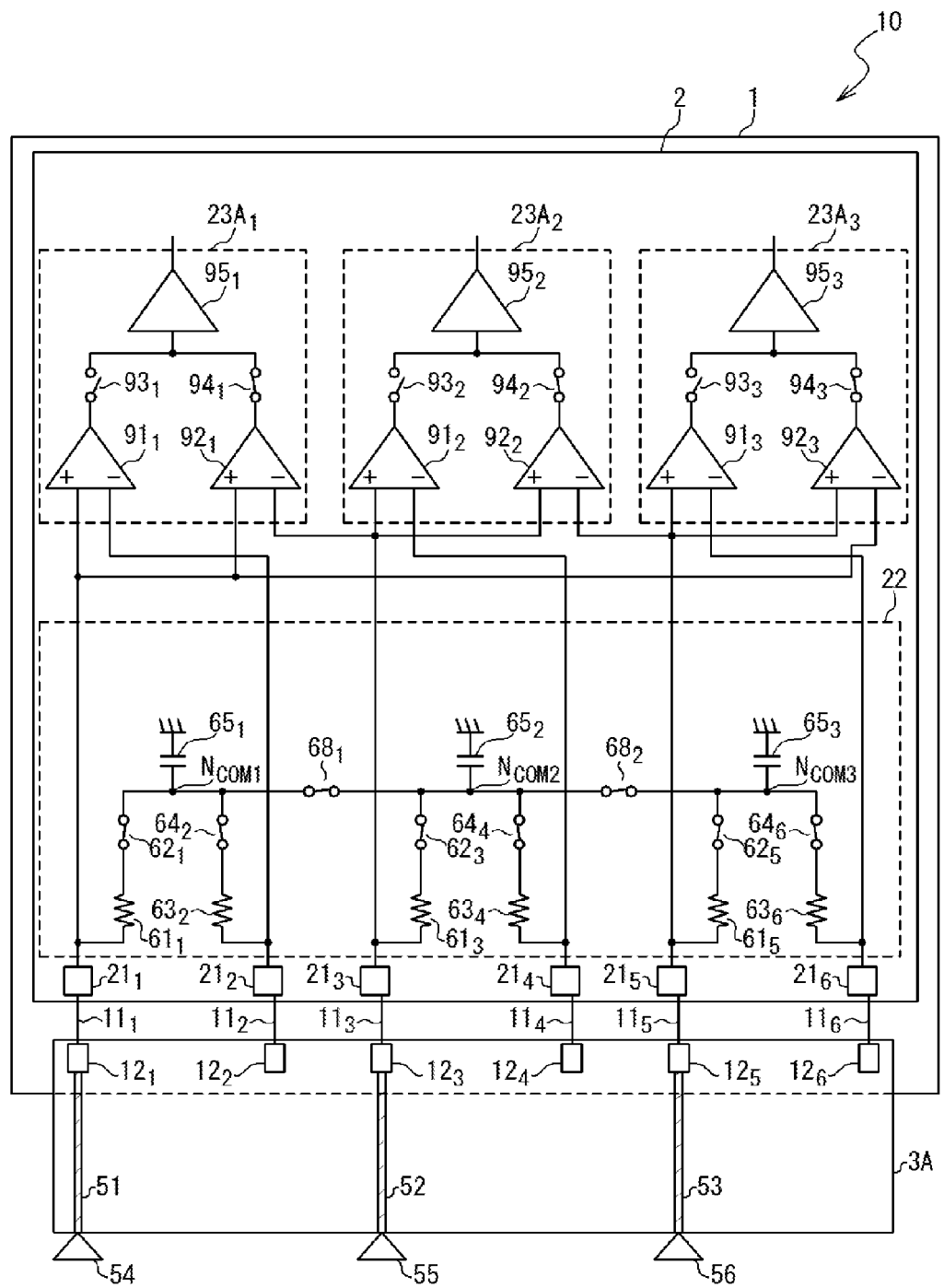
FIG. 19B illustrates another exemplary setting of the driver IC illustrated in FIG. 18 in the case when the driver IC performs communications in accordance with the MIPI C-PHY specification.

To address this problem, as illustrated in FIG. 19B, the switches $64_2$, $64_4$ and $64_6$ may be turned on in addition to the switches $62_1$, $62_3$, $62_5$, $68_1$ and $68_2$, when the driver IC 2 achieves the communications in accordance with the MIPI C-PHY specification. This avoids the external connection terminals $21_2$, $21_4$ and $21_6$ being set to floating, effectively reducing the signal cross-talk since the external connection terminals $21_2$, $21_4$ and $21_6$ are connected to the common connection node $N_{COM1-3}$ via the resistor elements $63_2$, $63_4$, $63_6$ and the switches $64_2$, $64_4$ and $64_6$.

Figure 19C:
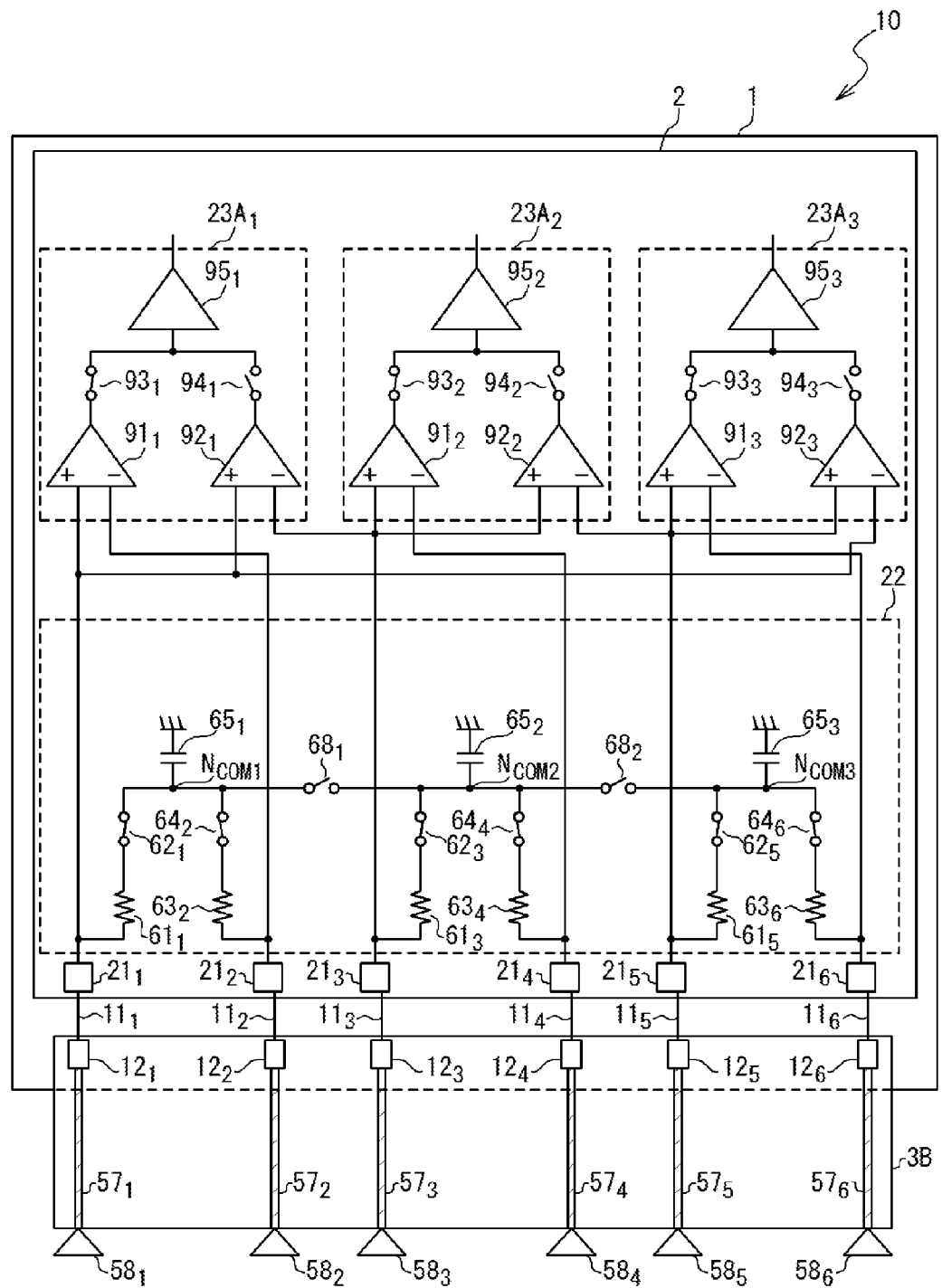
FIG. 19C illustrates an exemplary setting of the driver IC illustrated in FIG. 18 in the case when the driver IC performs communications in accordance with the MIPI D-PHY specification.

FIG. 19C illustrating an exemplary setting of the terminal resistor circuit 22 when the driver IC 2 performs the communications in accordance with the MIPI D-PHY specification. When the driver IC 2 performs the communications in accordance with the MIPI D-PHY specification, the transmission lines $57_1$ to $57_6$ disposed on the flexible circuit board 3 are connected to the external connection terminals $21_1$ to $21_6$, respectively. Such connections allow converting the differential signal transmitted over the transmission lines $57_1$ and $57_2$ into a single-ended signal with the receiver $23A_1$, converting the differential signal transmitted over the transmission lines $57_3$ and $57_4$ into a single-ended signal with the receiver $23A_2$, and converting the differential signal transmitted over the transmission lines $57_5$ and $57_6$ into a single-ended signal with the receiver $23A_3$.

To achieve the communications in accordance with the MIPI D-PHY specification, as described above, the input stage $91_1$ is selected in the receiver $23A_1$ by turning on the output select switch $93_1$ and turning off the output select switch $94_1$. Similarly, the input stage $91_2$ is selected in the receiver $23A_2$ by turning on the output select switch $93_2$ and turning off the output select switch $94_2$, and the input stage $91_3$ is selected in the receiver $23A_3$ by turning on the output select switch $93_3$ and turning off the output select switch $94_3$. Such connections allows converting the differential signal transmitted over the transmission lines $57_1$ and $57_2$ into a single-ended signal with the receiver $23A_1$, converting the differential signal transmitted over the transmission lines $57_3$ and $57_4$ into a single-ended signal with the receiver $23A_2$, and converting the differential signal transmitted over the transmission lines $57_5$ and $57_6$ into a single-ended signal with the receiver $23A_3$.

In the meantime, in the terminal resistor circuit 22, the switches $62_1$, $62_3$, $62_5$, $64_2$, $64_4$ and $64_6$ are turned on and the switches $68_1$ and $68_2$ are tuned off. This setting allows connecting the transmission lines $57_1$ and $57_2$ via the resistor elements $61_1$ and $63_2$, connecting the transmission lines $57_3$ and $57_4$ via the resistor elements $61_3$ and $63_4$ and connecting the transmission lines $57_5$ and $57_6$ via the resistor elements $61_5$ and $63_6$. Such connections are in accordance with the recommendation of the MIPI D-PHY specification. It would be preferable that the resistor elements $61_1$, $61_3$, $61_5$, $63_2$, $63_4$ and $63_6$ each have a resistance of $50\Omega$, since this results in that each pair of external connection terminals 21 are connected via a terminal resistor of $100\Omega$, as recommended by the MIPI D-PHY specification. It should be noted that, if the resistor elements $61_1$, $61_3$ and $61_5$ each have a resistance of $50\Omega$, this concurrently satisfies the recommendation by the MIPI C-PHY specification.

Although various embodiments of the present invention have been specifically described in the above, the present invention should not be construed as being limited to the above-described embodiments. A person skilled in the art would appreciate that the present invention may be implemented with various modifications. For example, although the above-described embodiments are directed to display modules incorporating a liquid crystal display panel, the present invention is applicable to a display module incorporating a different type of display panel (for example, an OLED (organic light emitting diode) display panel).

It should be noted that the present invention may be applicable to a semiconductor device module used in a system which performs communications in accordance with the MIPI D-PHY specification or the MIPI C-PHY specification. In this case, interconnections disposed on a flexible circuit board may be connected to external connection terminals of a semiconductor device (the driver IC 2 in the above-described embodiments) not via interconnections disposed on a display panel (the liquid crystal display panel 1 in the above-described embodiments).

It should be also noted that two or more of the above-described embodiments may be combined as long as no technical conflict occurs.

What is claimed is:

1. A semiconductor device module, comprising:
first to sixth external connection terminals;
a first receiver connected to the first and second external connection terminals;
a second receiver connected to the third and fourth external connection terminals;
a third receiver connected to the fifth and sixth external connection terminals;
a C-PHY block configured to generate first reception data by performing signal processing on signals received from the first to third receivers in accordance with the Mobile Industry Processor Interface (MIPI) C-PHY specification;
a D-PHY block configured to generate second reception data by performing signal processing on signals received from the first to third receivers in accordance with the MIPI D-PHY specification; and
a main processing section configured to selectively receive the first and second reception data and perform desired processing on the received data.

2. The semiconductor device module according to claim 1, wherein the C-PHY block comprises:
a clock recovery circuit configured to generate a first clock signal by performing clock recovery on the signals received from the first to third receivers;
a first latch section configured to generate a first data stream by latching the signals received from the first to third receivers in synchronization with the first clock signal; and
a first processing section configured to generate the first reception data based on the first data stream, and
wherein the D-PHY block comprises:
a second latch section configured to generate a second data stream by latching the signals received from the second and third receivers by using a first output signal output from the first receiver as a clock signal; and
a second processing section configured to generate the second reception data based on the second data stream.

3. The semiconductor device module according to claim 1, further comprising:
seventh and eighth external connection terminals; and
a fourth receiver connected to the seventh and eighth external connection terminals,
wherein the C-PHY block comprises:
a clock recovery circuit configured to generate a first clock signal by performing clock recovery on the signals received from the first to third receivers;
a first latch section configured to generate a first data stream by latching the signals received from the first to third receivers in synchronization with the first clock signal; and
a first processing section configured to generate the first reception data based on the first data stream, and
wherein the D-PHY block comprises:
a second latch section configured to generate a second data stream by latching the signals received from the first to third receivers by using a first output signal output from the fourth receiver as a clock signal; and
a second processing section configured to generate the second reception data based on the second data stream.

4. The semiconductor device module according to claim 1, further comprising:
a first capacitor connected between a first common connection node and a circuit ground;
a second capacitor connected between a second common connection node and the circuit ground;
a third capacitor connected between a third common connection node and the circuit ground;
a first resistor element connected between the first external connection terminal and a first node;
a first switch connected between the first node and the first common connection node;
a second resistor element;
a second switch, the second resistor element and the second switch being connected in series between the second external connection terminal and the first common connection node;
a third resistor element connected between the third external connection terminal and a second node;
a third switch connected between the second node and the second common connection node;
a fourth resistor element;
a fourth switch, the fourth resistor element and the fourth switch being connected in series between the fourth external connection terminal and the second common connection node;
a fifth resistor element connected between the fifth external connection terminal and a third node;
a fifth switch connected between the third node and the third common connection node;
a sixth resistor element;
a sixth switch, the sixth resistor element and the sixth switch being connected in series between the sixth external connection terminal and the third common connection node;
a fourth capacitor connected between a fourth common connection node and the circuit ground;
a seventh switch connected between the first node and the fourth common connection node;
an eighth switch connected between the second node and the fourth common connection node; and
a ninth switch connected between the third node and the fourth common connection node.

5. The semiconductor device module according to claim 1, further comprising:
a first capacitor connected between a first common connection node and a circuit ground;
a second capacitor connected between a second common connection node and the circuit ground;
a third capacitor connected between a third common connection node and the circuit ground;
a first resistor element connected between the first external connection terminal and a first node;
a first switch connected between the first node and the first common connection node;
a second resistor element;
a second switch, the second resistor element and the second switch being connected in series between the first external connection terminal and the first common connection node;
a third resistor element connected between the second external connection terminal and a second node;
a third switch connected between the second node and the first common connection node;

a fourth resistor element;
a fourth switch, the fourth resistor element and the fourth switch being connected in series between the second external connection terminal and the first common connection node;
a fifth resistor element connected between the third external connection terminal and a third node;
a fifth switch connected between the third node and the second common connection node;
a sixth resistor element;
a sixth switch, the sixth resistor element and the sixth switch being connected in series between the third external connection terminal and the second common connection node;
a seventh resistor element connected between the fourth external connection terminal and a fourth node;
a seventh switch connected between the fourth node and the second common connection node;
an eighth resistor element;
an eighth switch, the eighth resistor element and the eighth switch being connected between the fourth external connection terminal and the second common connection node;
a ninth resistor element connected between the fifth external connection terminal and a fifth node;
a ninth switch connected between the fifth node and the third common connection node;
a tenth resistor element;
a tenth switch, the tenth resistor element and the tenth switch being connected in series between the fifth external connection terminal and the third common connection node;
an eleventh resistor element connected between the sixth external connection terminal and a sixth node;
an eleventh switch connected between the sixth node and the third common connection node;
a twelfth resistor element;
a twelfth switch, the twelfth resistor element and the twelfth switch being connected in series between the sixth external connection terminal and the third common connection node;
a fourth capacitor connected between a fourth common connection node and the circuit ground;
a thirteenth switch connected between the first node and the fourth common connection node;
a fourteenth switch connected between the second node and the fourth common connection node;
a fifteenth switch connected between the third node and the fourth common connection node;
a sixteenth switch connected between the fourth node and the fourth common connection node;
a seventeenth switch connected between the fifth node and the fourth common connection node; and
an eighteenth switch connected between the sixth node and the fourth common connection node.

6. The semiconductor device module according to claim 1, further comprising:
a first input-side switch connected between the first external connection terminal and a first input of the first receiver;
a second input-side switch connected between the second external connection terminal and a second input of the first receiver;
a third input-side switch connected between the third external connection terminal and a first input of the second receiver;
a fourth input-side switch connected between the fourth external connection terminal and a second input of the second receiver;
a fifth input-side switch connected between the fifth external connection terminal and a first input of the third receiver;
a sixth input-side switch connected between the sixth external connection terminal and a second input of the third receiver;
a seventh input-side switch connected between the third external connection terminal and the second input of the first receiver;
an eighth input-side switch connected between the fifth external connection terminal and the second input of the second receiver; and
a ninth input-side switch connected between the first external connection terminal and the second input of the third receiver.

7. The semiconductor device module according to claim 1, wherein the first receiver includes:
a first input stage connected to the first external connection terminal and the second external connection terminal;
a second input stage connected to the first external connection terminal and the third external connection terminal;
a first output stage;
a first output select switch connected between an output of the first input stage and an input of the first output stage; and
a second output select switch connected between an output of the second input stage and the input of the first output stage;
wherein the second receiver includes:
a third input stage connected to the third external connection terminal and the fourth external connection terminal;
a fourth input stage connected to the third external connection terminal and the fifth external connection terminal;
a second output stage;
a third output select switch connected between an output of the third input stage and an input of the second output stage; and
a fourth output select switch connected between an output of the fourth input stage and the input of the second output stage,
wherein the third receiver includes:
a fifth input stage connected to the fifth external connection terminal and the sixth external connection terminal;
a sixth input stage connected to the fifth external connection terminal and the first external connection terminal;
a third output stage;
a fifth output select switch connected between an output of the fifth input stage and an input of the third output stage; and
a sixth output select switch connected between an output of the sixth input stage and the input of the third output stage.

8. The semiconductor device module according to claim 7, further comprising:
a first capacitor connected between a first common connection node and a circuit ground;
a second capacitor connected between a second common connection node and the circuit ground;

a third capacitor connected between a third common connection node and the circuit ground;

a first resistor element;

a first switch, the first resistor element and the first switch being connected in series between the first external connection terminal and the first common connection node;

a second resistor element;

a second switch, the second resistor element and the second switch being connected in series between the second external connection terminal and the first common connection node;

a third resistor element;

a third switch, the third resistor element and the third switch being connected in series between the third external connection terminal and the second common connection node;

a fourth resistor element;

a fourth switch, the fourth resistor element and the fourth switch being connected in series between the fourth external connection terminal and the second common connection node;

a fifth resistor element;

a fifth switch, the fifth resistor element and the fifth switch being connected in series between the fifth external connection terminal and the third common connection node;

a sixth resistor element;

a sixth switch, the sixth resistor element and the sixth switch being connected in series between the sixth external connection terminal and the third common connection node;

a seventh switch connected between the first common connection node and the second common connection node; and an eighth switch connected between the second common connection node and the third common connection node.

9. The semiconductor device module according to claim 1, comprising:
a circuit board comprising:
a first transmission line electrically connected to the first external connection terminal;
a second transmission line electrically connected to the fifth external connection terminal; and
a third transmission line electrically connected to the third external connection terminal,
wherein the main processing section of the semiconductor device receives the first reception data to perform desired processing on the first reception data.

10. The semiconductor device module according to claim 9, wherein the first transmission line is electrically connected to the fourth external connection terminal,
wherein the second transmission line is electrically connected to the second external connection terminal, and
wherein the third transmission line is electrically connected to the sixth external connection terminal.

11. The semiconductor device module according to claim 9, wherein the C-PHY block comprises:
a clock recovery circuit configured to generate a first clock signal by performing clock recovery on the signals received from the first to third receivers;
a first latch section configured to generate a first data stream by latching the signals received from the first to third receivers in synchronization with the first clock signal; and a first processing section configured to generate the first reception data based on the first data stream, and
wherein the D-PHY block comprises:
a second latch section configured to generate a second data stream by latching the signals received from the second and third receivers by using a first output signal output from the first receiver as a clock signal; and
a second processing section configured to generate the second reception data based on the second data stream.

12. The semiconductor device module of claim 1, comprising:
a circuit board including first to sixth transmission lines electrically connected to the first to sixth external connection terminals, respectively,
wherein the main processing section of the semiconductor device receives the second reception data to perform desired processing on the second reception data.

13. The semiconductor device module according to claim 12, wherein the C-PHY block comprises:
a clock recovery circuit configured to generate a first clock signal by performing clock recovery on the signals received from the first to third receivers;
a first latch section configured to generate a first data stream by latching the signals received from the first to third receivers in synchronization with the first clock signal; and
a first processing section configured to generate the first reception data based on the first data stream, and
wherein the D-PHY block comprises:
a second latch section configured to generate a second data stream by latching the signals received from the second and third receivers by using a first output signal output from the first receiver as a clock signal; and
a second processing section configured to generate the second reception data based on the second data stream.

14. A display module for driving a display panel, comprising:
first to sixth external connection terminals;
a first receiver connected to the first and second external connection terminals;
a second receiver connected to the third and fourth external connection terminals;
a third receiver connected to the fifth and sixth external connection terminals;
a C-PHY block configured to generate first reception data by performing signal processing on signals received from the first to third receivers in accordance with the Mobile Industry Processor Interface (MIPI) C-PHY specification;
a D-PHY block configured to generate second reception data by performing signal processing on signals received from the first to third receivers in accordance with the MIPI D-PHY specification; and
a main processing section configured to selectively receive the first and second reception data and drive the display panel in response to the received data.

15. The display module according to claim 14, wherein the C-PHY block comprises:
a clock recovery circuit configured to generate a first clock signal by performing clock recovery on the signals received from the first to third receivers;

a first latch section configured to generate a first data stream by latching the signals received from the first to third receivers in synchronization with the first clock signal; and
a first processing section configured to generate the first reception data based on the first data stream, and
wherein the D-PHY block comprises:
a second latch section configured to generate a second data stream by latching the signals received from the second and third receivers by using a first output signal output from the first receiver as a clock signal; and
a second processing section configured to generate the second reception data based on the second data stream.

16. The display module according to claim 14, comprising:
a flexible circuit board including:
a first transmission line electrically connected to the first external connection terminal;
a second transmission line electrically connected to the fifth external connection terminal; and
a third transmission line electrically connected to the third external connection terminal,
wherein the main processing section receives the first reception data and drives the display panel in response to the first reception data.

17. The display module according to claim 16, wherein the C-PHY block comprises:
a clock recovery circuit configured to generate a first clock signal by performing clock recovery on the signals received from the first to third receivers;
a first latch section configured to generate a first data stream by latching the signals received from the first to third receivers in synchronization with the first clock signal; and
a first processing section configured to generate the first reception data based on the first data stream, and
wherein the D-PHY block comprises:
a second latch section configured to generate a second data stream by latching the signals received from the second and third receivers by using a first output signal output from the first receiver as a clock signal; and
a second processing section configured to generate the second reception data based on the second data stream.

18. The display module according to claim 14, comprising:
a flexible circuit board including first to third transmission lines,
wherein the display panel comprises:
a substrate;
first to sixth connection terminals formed on the substrate and connected to the first to sixth external connection terminals, respectively;
seventh to ninth connection terminals formed on the substrate;
a first interconnection configured to connect the first connection terminal and the seventh connection terminal;
a second interconnection configured to connect the third connection terminal and the eighth connection terminal;
a third interconnection configured to connect the fifth connection terminal and the ninth connection terminal;
a fourth interconnection configured to connect the first connection terminal and the sixth connection terminal;
a fifth interconnection configured to connect the second connection terminal and the third connection terminal; and
a sixth interconnection configured to connect the fourth connection terminal and the fifth connection terminal,
wherein the first to third transmission lines of the flexible circuit board are electrically connected to the seventh to ninth connection terminals of the display panel, respectively.

19. The display module according to claim 14, comprising:
a flexible circuit board,
wherein the display panel includes:
a substrate;
first to sixth connection terminals formed on the substrate and connected to the first to sixth external connection terminals, respectively;
seventh to twelfth connection terminals arrayed in a given direction on the substrate; and
first to sixth interconnections configured to connect the first to sixth connection terminals to the seventh to twelfth connection terminals, respectively,
wherein the flexible circuit board includes:
thirteenth to eighteenth connection terminals arrayed in the given direction and connected to the seventh to twelfth connection terminals of the display panel, respectively;
first to third transmission lines; and
seventh to ninth interconnections;
wherein the first transmission line, the second transmission line and the third transmission line are electrically connected to the thirteenth connection terminal, the fifteenth connection terminal and the seventeenth connection terminal, respectively,
wherein the thirteenth connection terminal and the eighteenth connection terminal are positioned at both ends of an array of the thirteenth to eighteenth connection terminals,
wherein the seventh interconnection is configured to connect the thirteenth connection terminal and the eighteenth connection terminal,
wherein the eighth interconnection is configured to connect the fourteenth connection terminal and the fifteenth connection terminal,
wherein the ninth interconnection is configured to connect the sixteenth connection terminal and the seventeenth connection terminal, and
wherein the seventh interconnection is positioned opposite to a region in which the first to third transmission lines are formed across the array of the thirteenth to eighteenth connection terminals.

20. A display module, comprising:
a display panel;
a display panel driver, comprising:
first to sixth external connection terminals;
a first receiver connected to the first and second external connection terminals;
a second receiver connected to the third and fourth external connection terminals;
a third receiver connected to the fifth and sixth external connection terminals;
a C-PHY block configured to generate first reception data by performing signal processing on signals received from the first to third receivers in accordance with the Mobile Industry Processor Interface (MIPI) C-PHY specification;

a D-PHY block configured to generate second reception data by performing signal processing on signals received from the first to third receivers in accordance with the MIPI D-PHY specification;

a main processing section configured to selectively receive the first and second reception data and drive the display panel in response to the received data; and a flexible circuit board including first to sixth transmission lines electrically connected to the first to sixth external connection terminals, respectively, wherein the main processing section of the display panel driver receives the second reception data and drives the display panel in response to the second reception data.

* * * * *